United States Patent
Morimoto et al.

(10) Patent No.: US 9,974,178 B2
(45) Date of Patent: May 15, 2018

(54) MULTIPOLAR LEAD PARTS AND BOARD COUPLING DEVICE

(71) Applicant: NSK Ltd., Tokyo (JP)

(72) Inventors: Masakazu Morimoto, Tokyo (JP); Noboru Kaneko, Tokyo (JP); Tadayoshi Osakabe, Tokyo (JP)

(73) Assignee: NSK LTD., Tokyo (JP)

( * ) Notice: Subject to any disclaimer, the term of this patent is extended or adjusted under 35 U.S.C. 154(b) by 0 days. days.

(21) Appl. No.: 15/321,253

(22) PCT Filed: Sep. 10, 2015

(86) PCT No.: PCT/JP2015/075697
§ 371 (c)(1),
(2) Date: Dec. 22, 2016

(87) PCT Pub. No.: WO2016/039413
PCT Pub. Date: Mar. 17, 2016

(65) Prior Publication Data
US 2017/0208687 A1    Jul. 20, 2017

(30) Foreign Application Priority Data

Sep. 11, 2014 (JP) .................................. 2014-185119
Sep. 8, 2015 (JP) .................................. 2015-176880

(51) Int. Cl.
H05K 1/18          (2006.01)
H05K 3/34          (2006.01)

(52) U.S. Cl.
CPC ............. *H05K 1/18* (2013.01); *H05K 3/3426* (2013.01)

(58) Field of Classification Search
CPC  H05K 1/18; H05K 3/34; H05K 3/341; H05K 3/3426; H05K 3/3421
See application file for complete search history.

(56) References Cited

U.S. PATENT DOCUMENTS 3,711,752 A * 1/1973 Nier ...................... H01L 23/488
                                                                257/674
4,777,564 A * 10/1988 Derfiny ............. H01L 23/49555
                                                                257/674
(Continued)

FOREIGN PATENT DOCUMENTS

JP          51-007635 A         1/1976
JP          63-266787 A         11/1988
(Continued)

OTHER PUBLICATIONS

International Search Report of PCT/JP2015/075697 dated Dec. 8, 2015 [PCT/ISA/210].

(Continued)

*Primary Examiner* — Nathan Milakovich
(74) *Attorney, Agent, or Firm* — Sughrue Mion, PLLC

(57) ABSTRACT

Multipolar lead parts having plural leads and a retaining member, wherein the retaining member includes a cylindrical portion so as to cover peripheries of the leads, the cylindrical portion facing in a board direction; wherein the leads each include an upper-side board coupling portion and a lower-side board coupling portion; wherein the lower-side board coupling portion comprises a forward protruding portion that the other end side of each of the leads is bent in a direction orthogonal to an arrangement face of the leads, a vertical portion extending downward from a front end, a solder coupling portion extending backward from a lower end, and a rising portion extending upward from the solder coupling portion; and wherein said rising portion is formed as to have an obtuse angle from said solder coupling portion regardless of a bending angle of said vertical portion with respect to said solder coupling portion.

17 Claims, 20 Drawing Sheets

(56) References Cited

U.S. PATENT DOCUMENTS

| | | | |
|---|---|---|---|
| 5,411,236 A | | 5/1995 | Morita et al. |
| 5,490,788 A | * | 2/1996 | Mazzochette .......... H01R 12/57 439/83 |
| 5,788,544 A | * | 8/1998 | Drekmeier ............. H01R 12/57 29/842 |
| 5,925,927 A | * | 7/1999 | Orcutt ............... H01L 23/49548 257/666 |
| 6,101,099 A | * | 8/2000 | Olsson ................ H05K 1/0243 174/255 |
| 6,113,053 A | * | 9/2000 | Kumagai ............. G01R 1/0416 174/263 |
| 6,863,578 B2 | * | 3/2005 | Templin ................ H01R 9/096 439/62 |
| 9,065,234 B2 | * | 6/2015 | Holste ............... H01L 23/49555 |
| 9,647,363 B2 | * | 5/2017 | Summers ............. H01R 12/718 |
| 2010/0227506 A1 | * | 9/2010 | Kawahara ............ H05K 3/3426 439/625 |
| 2015/0144392 A1 | * | 5/2015 | Sunaga ................ H01R 12/523 174/262 |
| 2015/0244088 A1 | * | 8/2015 | Mongold ............... H01R 12/57 439/83 |
| 2015/0311608 A1 | * | 10/2015 | Schwartz ............. H01R 12/585 439/65 |
| 2016/0181221 A1 | * | 6/2016 | Sunaga .................. H01L 24/37 257/139 |

FOREIGN PATENT DOCUMENTS

| | | |
|---|---|---|
| JP | 04-091071 U | 8/1992 |
| JP | 04-237155 A | 8/1992 |
| JP | 05-079870 U | 10/1993 |
| JP | 09-115574 A | 5/1997 |
| JP | 11-1 54578 A | 6/1999 |
| JP | 2006-344458 A | 12/2006 |
| JP | 2007-188697 A | 7/2007 |
| JP | 2007-242473 A | 9/2007 |
| WO | 2014/122883 A1 | 8/2014 |

OTHER PUBLICATIONS

International Preliminary Report on Patentability of PCT/JP2015/075697 dated Aug. 18, 2016 [PCT/IPEA/409].

* cited by examiner

PRIOR ART

PRIOR ART

US 9,974,178 B2

MULTIPOLAR LEAD PARTS AND BOARD COUPLING DEVICE

CROSS REFERENCE TO RELATED APPLICATIONS

This application is a National Stage of International Application No. PCT/JP2015/075697, filed Sep. 10, 2015, claiming priorities based on Japanese Patent Application Nos. 2014-185119, filed Sep. 11, 2014 and 2015-176880, filed Sep. 8, 2015, the contents of all of which are incorporated herein by reference in their entirety.

TECHNICAL FIELD

The present invention relates to multipolar lead parts for mutually coupling a plurality of circuit boards mounted electronic parts, and more specifically, relates to the multipolar lead parts and a board coupling device, capable of effectively preventing a position aberration of an end portion of the multipolar lead parts in soldering the multipolar lead parts to a board.

BACKGROUND ART

Conventionally, circuit boards included in an electronic appliance are provided so as to be divided into at least two inside the electronic appliance, in accordance with characteristics and configurations of circuits, in some cases.

For example, a power circuit board mounted a power element thereon, such as a field effect transistor (FET) or an insulated gate bipolar transistor (IGBT), through which a large current flows, having a large amount of heat generation, and a control circuit board that performs a control calculation, such as an assist torque, out of the circuit boards included in the electronic appliance, such as a control unit (ECU) that performs driving control of an electric power steering apparatus used in a vehicle, such as a motor vehicle, are separately provided. Furthermore, the circuit boards are combined with another board so that the ECU includes a multilayer board comprising a plurality of the boards, in some cases.

In a case where the ECU comprises the above configuration, the following configuration is applied. Aboard surface of the power circuit board and a board surface of the control circuit board are arranged apart in parallel at a predetermined interval so as to face each other. For example, the power circuit board is arranged on the side of a bottom surface of a housing of the ECU, on which a heat dissipating sheet is provided, and the control circuit board is arranged apart at the predetermined interval above the power circuit board.

Therefore, in a case where the electronic appliance has the plural circuit boards constituted in the above configuration, as described in the exemplary circuit boards of the ECU, a connector for mutually, electrically coupling plural contacts provided to the plural circuit boards, such as the power circuit board and the control circuit board arranged apart from each other, is required.

Thus, for example, techniques described in Japanese Unexamined Patent Application Publication No. 2007-242473 A (Patent Document 1), Japanese Unexamined Utility Model Application Publication No. S51-7635 U (Patent Document 2), and Japanese Unexamined Patent Application Publication No. 11-154578 A (Patent Document 3) have been disclosed in order to meet the requirement.

In the techniques, multipolar lead parts 501 described in Patent Document 1 comprises plural connector pins 502A to 502J including an upper-side coupling portion 521, a lower-side coupling portion 524, retaining members 503A and 503B and curved portions 522 and 523, as shown in FIG. 17. The multipolar lead parts 501 more specifically comprises the plural connector pins arranged in a direction orthogonal to a coupling direction and the retaining members retaining the plural connector pins at a predetermined interval, the plural connector pins including a first curved portion curving in an arrangement plane including the arrangement direction and a second curved portion folding and curving at least one or more in a direction orthogonal to the arrangement plane. An object is to mitigate a stress that occurs in setting (inserting) a connector or in making a coupling under an environment in which vibrations are added at a high temperature, and to continue to retain a stable coupling state.

Further, a wiring board coupling tool 609 described in Patent Document 2 has a configuration comprising an insulating plate 608 integrally sticking an intermediate portion of plural coupling conductors 607 that has been arranged in parallel, and includes a bending portion 611 or a protrusion provided to each protruding portion of each of the conductors, protruding from the insulating plate 608 to two directions, as shown in a front view of FIG. 18A and in a side view of FIG. 18B, respectively. An object is to make a coupling between wiring boards in accordance with an interval between the wiring boards without dependence on the width of the insulating plate 608, by providing the bending portion 611 or the protrusion (not shown) to the wiring board coupling tool 609.

Furthermore, the technique described in Patent Document 3 is a method of manufacturing an insulation-displacement connector 730 including various types to be attached to a connector portion of a junction box. An object is to improve working efficiency relating to attachment of various types of insulation-displacement connectors 710A and 710B to a connector and to achieve a cost reduction of the junction box by coupling the various types of insulation-displacement connectors to be attached to the same connector, with a resin member 720 and then making the insulation-displacement connectors (710A and 710B) a part as shown in FIG. 19.

THE LIST OF PRIOR ART DOCUMENTS

Patent Documents

Patent Document 1: Japanese Unexamined Patent Application Publication No. 2007-242473 A
Patent Document 2: Japanese Unexamined Utility Model Application Publication No. S51-7635 U
Patent Document 3: Japanese Unexamined Patent Application Publication No. 11-154578 A

SUMMARY OF THE INVENTION

Problems to be Solved by the Invention

However, the techniques described in Patent Documents 1 to 3 have the following problems.

That is, the multipolar lead parts 501 described in Patent Document 1 can integrate the plural connector pins 502A to 502J using the retaining members 503A and 503B, and can position the upper-side coupling portion 521 and the lower-side coupling portion 524 with respect to a lower mounting board and an upper mounting board (not shown), respectively. However, since each of the connector pins is formed by further narrowing a sheet conductive member, such as a metal sheet, in width, so that there is a fear that a deformation occurs due to action of some external force when the upper-side coupling portion 521 is inserted through through-holes formed through the upper mounting board so that solder coupling is performed or when the multipolar lead parts 501 are conveyed. When a specific connector pin deforms out of the plural connector pins, a position aberration occurs in the connector pin. When the deformation occurs in the specific connector pin out of the plural connector pins, there is a fear that the position aberration occurs in another connector pin through the retaining members (503A and 503B). When the position aberration of the connector pins occurs in the upper-side coupling portion 521, there is a fear that insertion into the through-holes formed through the upper mounting board cannot be performed.

The wiring board coupling tool 609 described in Patent Document 2 comprises the coupling conductors 607 formed to have requisite minimum thinness in pin shape, so that a problem also occurs similarly to the multipolar lead parts described in Patent Document 1.

When the insulation-displacement connectors 730 are provided by the method of manufacturing the insulation-displacement connectors, described in Patent Document 3, each reference insulation-displacement connector has a tab portion and has a relatively wide width, but there is a fear that a deformation occurs when some external force acts, and a technical problem similar to the problem included in Patent Document 1 or 2 occurs.

Furthermore, when the multipolar lead parts described in Patent Document 1 is attached to the boards, an upper-side portion of each of the connector pins (leads) included in the multipolar lead parts is coupled to the upper-side board and a lower-side portion of each of the leads comprised the multipolar lead parts is coupled to the lower-side board. In this case, regarding the upper-side portion of each of the leads, the upper portion of each of the leads is inserted into a land (for example, each of the through-holes) provided on the upper-side board so as to be soldered. Regarding the lower portion, the lower-side coupling portion of a lower portion of each of the leads may be soldered by a reflow method.

The soldering by the reflow method is performed as follows: As illustrated in FIG. 20A, a method, such as printing, coats solder paste 820 on a lower surface of a lower-side board coupling portion 813 of a lower portion of a lead 810, and then the remaining heat and main heating are performed with a position relationship between a lower-side board 830 and the lead 810, remaining. Then, the coupling is performed between the lower-side board coupling portion 813 of the lead 810 and the lower-side board 830, and then cooling is performed.

However, as illustrated in FIG. 20A, a mode of both ends of the lower-side board coupling portion 813 out of the lead 810 is asymmetrically formed with respect to molten solder formed during the reflow, in a mode of the conventional lead. Therefore, for example, as illustrated in FIG. 20B, when the solder paste 820 melts in a reflow furnace, a region to which the molten solder adheres becomes asymmetric at a both-end portion of the lower-side board coupling portion 813 as a region surrounded with a dotted line in FIG. 20B. As a result, a force to be added to the both-end portion of the lower-side board coupling portion 813 of the lead becomes ununiform due to reception of surface tension of the molten solder. Thus, reception of influence in a direction in which the entire lead portion stands causes a position P1 of an upper-side portion of the lead 810 to be slightly different from a position P0 before the reflow processing. As a result, there is a fear that the position accuracy of soldering the upper-side portion of the lead to an upper-side board (not shown) falls down.

Accordingly, the present invention has been made in order to solve the above conventional problems. An object of the present invention is to provide multipolar lead parts and a board coupling device, capable of preventing a deformation of a specific lead out of plural leads arranged in a line in a direction orthogonal to a coupling direction of an upper-side board and preventing a position aberration of the lead and the position aberration of other leads, and is also to prevent a coupling direction of the leads from varying in soldering the leads to a lower-side board and is additionally to prevent coupling positions of upper-side portions of the leads with respect to the upper-side board with respect to the upper-side board (positions with respect to, for example, through-holes provided on the board) from being considerably dislocated even when the variation occurs in the coupling direction of the leads.

Means for Solving the Problems

In order to solve the above problems, the present invention provides multipolar lead parts having plural leads arranged in one direction orthogonal to a coupling direction and a retaining member retaining the plural leads at a predetermined interval, comprising: wherein the retaining member includes a cylindrical portion provided to a portion or an entirety of the plural leads so as to cover peripheries of the plural leads, the cylindrical portion facing in a board direction; wherein the plural leads each include an upper-side board coupling portion provided on one end side and a lower-side board coupling portion provided on another end side; wherein the lower-side board coupling portion comprises a forward protruding portion that the other end side of each of the plural leads is bent in a direction orthogonal to an arrangement face of the plural leads, a vertical portion extending downward from a front end of the forward protruding portion, a solder coupling portion extending backward from a lower end of the vertical portion, and a rising portion extending upward from the solder coupling portion; and wherein a bending angle of the rising portion with respect to the solder coupling portion is formed so as to be substantially identical to a bending angle of the vertical portion with respect to the solder coupling portion.

Further, the object of the present invention is more effectively achieved by that wherein the bending angle of the rising portion has an angle of gradually rising from the solder coupling portion regardless of the bending angle of the vertical portion with respect to said solder coupling portion; or wherein a width of the rising portion increases toward an end of the rising portion; or wherein the cylindrical portion is integrally formed with the retaining member; or wherein the cylindrical portion is provided to an outermost lead out of the plural leads arranged in parallel; or wherein an end of the cylindrical portion is tapered, or wherein an intermediate portion of said cylindrical portion includes an opening for a presser foot fixture for suppressing a deformation of the plural lead; or wherein the solder coupling portion included in the lower-side board coupling portion of each of the plural leads is arranged zigzag in the arrangement direction of the plural leads.

Furthermore, in order to solve the above problems, the present invention provides a board coupling device comprising a pair of multipolar lead parts described-above arranged along opposite sides on the opposite sides of a quadrangular board, wherein the end of the cylindrical portion provided outermost in the plural leads supports another board.

Effects of the Invention

Multipolar lead parts according to the present invention, comprise a protective portion that protects a specific lead out of plural leads, extend to protrude from a retaining member in a coupling direction of the leads being protected, and cover the periphery of the leads, provided at a portion of the retaining member. Thus, the protective portion can protect the specific lead and can prevent the leads from being deformed even when some external force acts on the leads, during coupling to a circuit board or during conveying of the multipolar lead parts. Accordingly, a position aberration of the specific lead can be prevented, and additionally position aberration of other leads due to the deformation of the specific lead can be prevented. Accordingly, the leads of the multipolar lead parts can be appropriately and smoothly inserted through the through-holes of the circuit board.

A rising portion is provided to a lower-side board coupling portion of each of the leads, and both-end portions of a solder coupling portion of the lower-side board coupling portion (a surface mount coupling portion) have the angles of coupling portions of each of the leads, which are substantially the same, viewed from the board. Thus, even when the soldering is performed by a reflow process, the position aberration of the leads can be prevented from occurring in the coupling direction, and the upper side portions of the leads can be appropriately and smoothly inserted through the through-holes of the circuit board.

When each of the leads which comprise the multipolar lead parts according to the present invention is arranged so as to make the solder coupling portion of each of the leads zigzag, stability on the board at the solder coupling portion improves so that the position aberration of each of the leads can be effectively prevented.

A board coupling device according to the present invention can firmly perform coupling of the board, and can inhibit the position aberration in soldering the multipolar lead parts to the board.

MODE FOR CARRYING OUT THE INVENTION

Embodiments of the present invention will be described below with an example in which the present invention has been applied to an electronic control unit (ECU) of an electric power steering apparatus being an on-vehicle electronic appliance.

Here, the electric power steering apparatus applies a steering auxiliary force (an assist force) to a steering mechanism of a vehicle by using a rotational force of a motor, and a driving force of the motor is used through a reduction mechanism so that a transmission mechanism, such as gears or a belt, applies the steering auxiliary force to a steering shaft or a rack shaft. This type of electric power steering apparatus (EPS) performs a feedback control of a motor current in order to generate the torque of the steering auxiliary force, accurately.

The feedback control adjusts a motor applied-voltage so as to decrease a difference between a steering auxiliary command value (a current command value) and a motor current detected value. Typically, the duty of a pulse width modulation (PWM) is adjusted so that the motor applied-voltage is adjusted.

Figure 1:
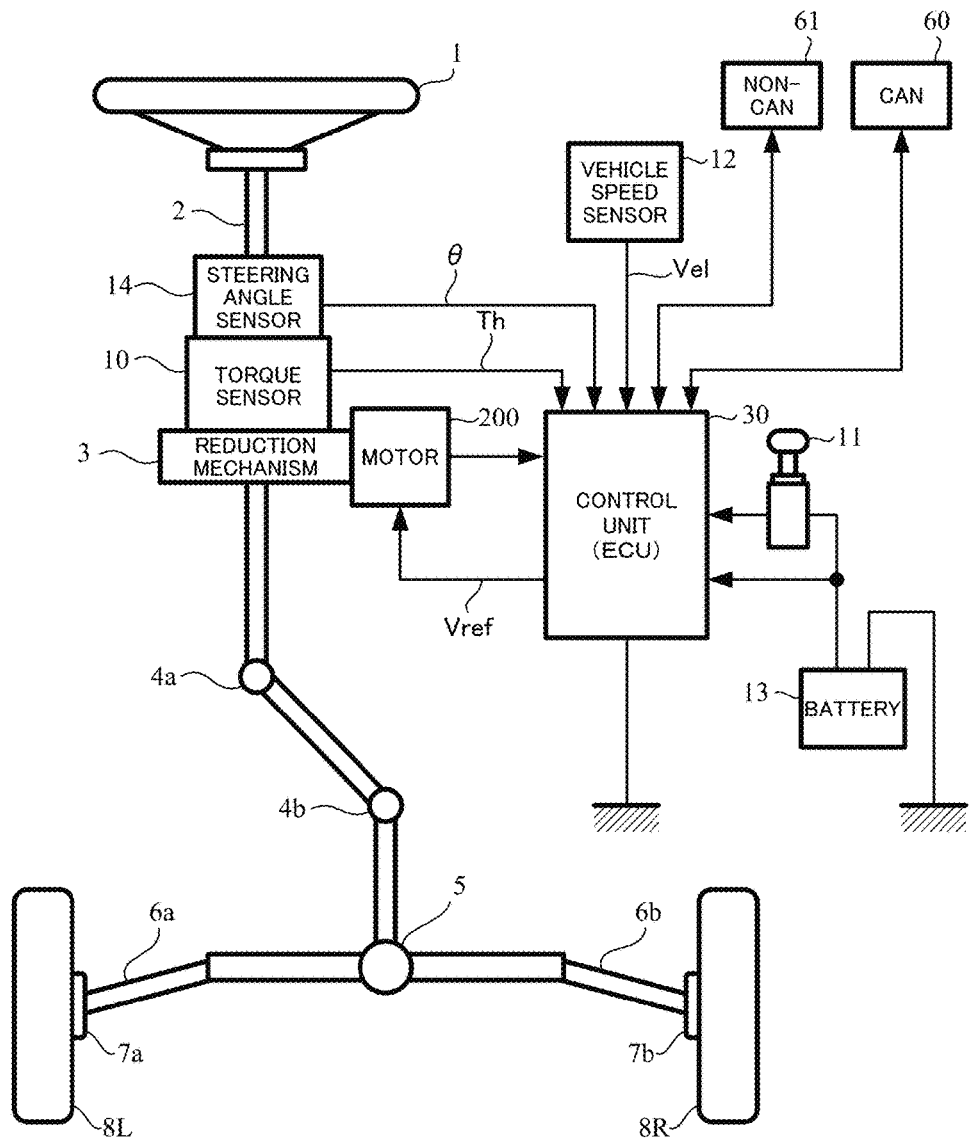
FIG. 1 is a block diagram of a basic structure of an electric power steering apparatus to which an ECU including a connector according to the present invention is coupled.

A typical configuration of the electric power steering apparatus will be described with the illustration in FIG. 1. A column shaft (the steering shaft, a handle shaft) 2 of a handle 1 is coupled to steered wheels 8L and 8R through reduction gears of the reduction mechanism 3, universal joints 4a and 4b, a pinion rack mechanism 5, tie rods 6a and 6b, and further through hub units 7a and 7b. A torque sensor 10 that detects a steering torque Th of the handle 1, and a steering angle sensor 14 that detects a steering angle θ, are provided to the column shaft 2. The motor 200 that assists the steering force of the handle 1, is coupled to the column shaft 2 through the reduction gears of the reduction mechanism 3 (a gear ratio n).

The control unit (ECU) 30 that controls the electric power steering apparatus comprises a micro control unit (MCU) serving as key parts, and a power is supplied into the control unit 30 from a battery 13 and in addition an ignition key signal is inputted through an ignition key 11.

The control unit (ECU) 30 comprising the above configuration, performs a calculation of the current command value of an assist (steering auxiliary) command based on the steering torque Th detected by the torque sensor 10 and a vehicle speed Vel detected by a vehicle speed sensor 12, and controls a current to be supplied to the motor 200, with a voltage control command value Vref calculating the current command value to which compensation has been performed, for example. (Note that, the steering angle sensor 14 is not compulsory, and may be not provided. The steering angle can be acquired from a rotational position sensor, such as a resolver, coupled to the motor.)

A controller area network (CAN) 60 that receives varieties of information of the vehicle, is coupled to the control unit (ECU) 30, and the vehicle speed Vel can be received from the CAN 60. A non-CAN 61 that receives, for example, communication, an analog/digital signal, and a radio wave, is also coupled to the control unit (ECU) 30 other than the CAN 60.

Figure 2:
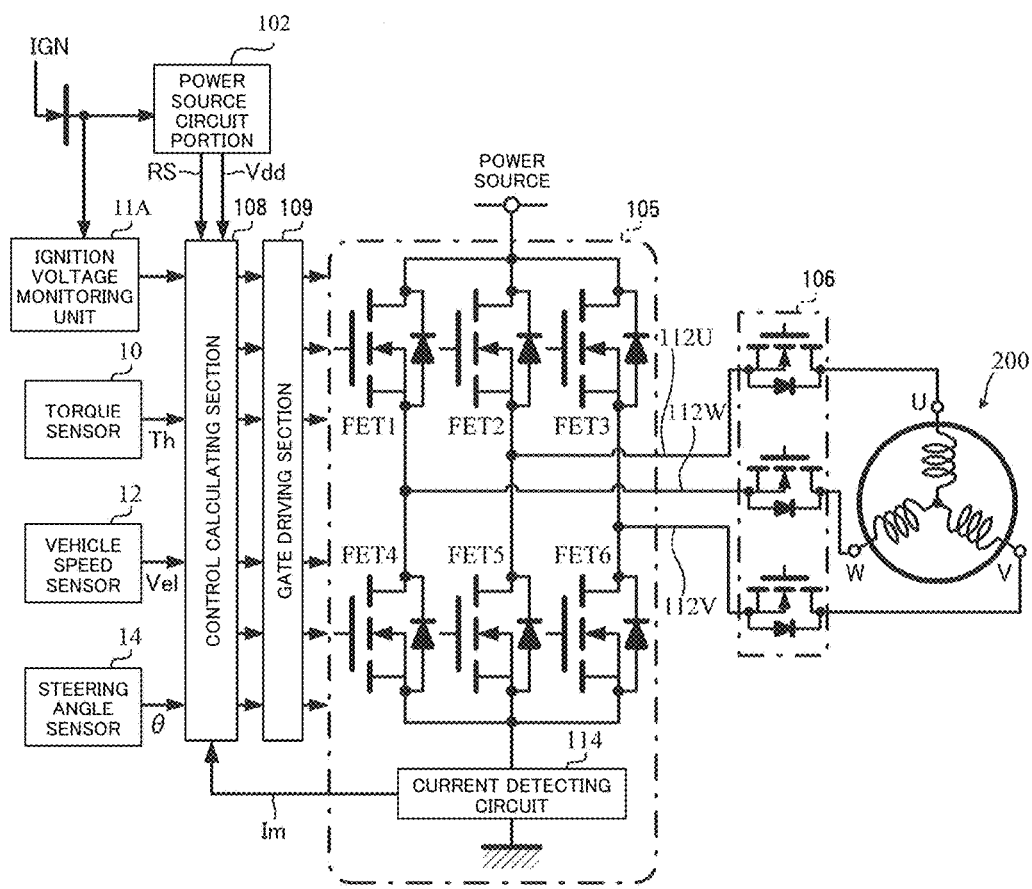
FIG. 2 is a schematic diagram of a basic configuration of the ECU of the electric power steering apparatus.

The control unit (ECU) 30 generally includes a basic configuration and functions as shown in FIG. 2 and as described next.

That is, the steering torque Th detected by the torque sensor 10 and the vehicle speed Vel detected by the vehicle speed sensor 12 are inputted into a control calculating section 108 acting as a control calculating unit. The current command value calculated in the control calculating section 108 is inputted into a gate driving section 109. Gate driving signals formed in the gate driving section 109 based on, for example, the current command value, are inputted into a motor driving section 105 comprising an FET-bridge configuration. A current from the motor driving section 105 drives the electric power motor 200 comprised a three-phase brushless motor, through a cut-off unit 106 for an emergency stop. The current from the motor driving section 105 is detected by a current detecting circuit 114. As a feedback current, the current that has been detected is inputted into the control calculating section 108. The steering angle sensor 14 inputs the steering angle θ to the control calculating section 108.

An ignition signal IGN from the ignition key is inputted into an ignition voltage monitoring unit 11A and a power source circuit portion 102. The power source circuit portion 102 inputs a power source voltage Vdd to the control calculating section 108, and additionally inputs a reset signal RS for stopping the apparatus, to the control calculating section 108. The cut-off unit 106 comprises electronic relays that interrupt the three-phase current toward the motor 200.

An inverter which constitutes the motor driving section 105, comprises a three-phase bridge having upper and lower arms including an upper FET 2 and a lower FET 5 of a U-phase, respectively, upper and lower arms including an upper FET 3 and a lower FET 6 of a V-phase, respectively, and upper and lower arms including an upper FET 1 and a lower FET 4 of a W-phase, respectively. A gate of each of the FETs is driven by output of the gate driving section 109 and each of the FETs has a freewheel diode.

Figure 3:
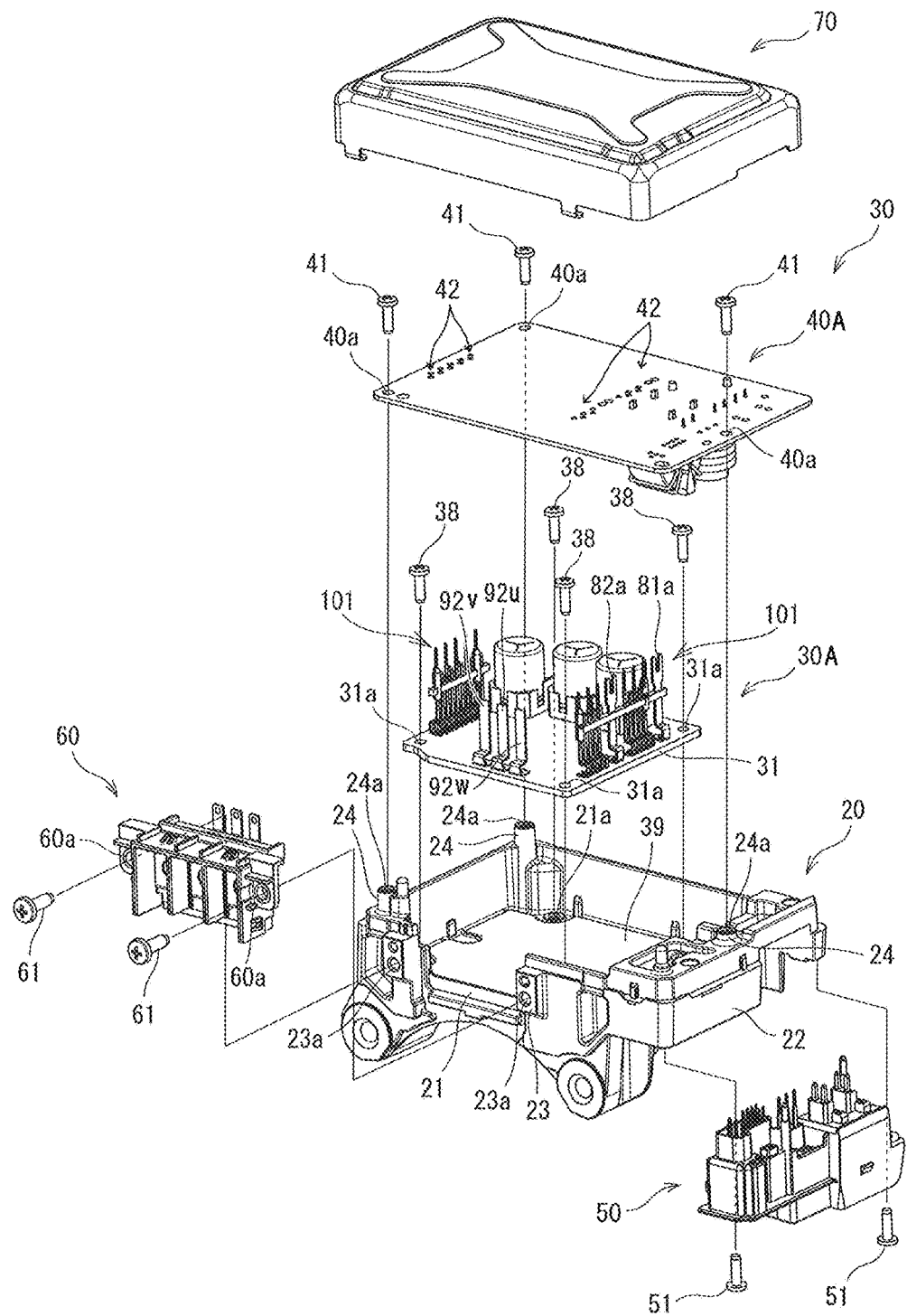
FIG. 3 is an exploded perspective view of a schematic structure of the ECU using multipolar lead parts according to the present invention.

FIG. 3 is an exploded perspective view of the control unit 30 using the multipolar lead parts according to the present invention. The control unit 30 according to the present embodiment, includes a case 20 being a housing, a semiconductor module 30A being a power module including the motor driving section 105, a heat dissipating sheet 39, a control circuit board 40A including the control calculating section 108 and the gate driving section 109, a power and signal connector 50, a three-phase-output connector 60, and a cover 70.

Here, the case 20 is formed so as to be substantially rectangular, and includes a plate-like semiconductor module loading portion 21 for loading the semiconductor module 30A thereonto, a power and signal connector mounting portion 22 for mounting the power and signal connector 50 thereon, provided to an end portion of the semiconductor module loading portion 21 in a longitudinal direction, and a three-phase-output connector mounting portion 23 for mounting the three-phase-output connector 60 thereon, provided to an end portion of the semiconductor module loading portion 21 in a width direction.

A plurality of threaded holes 21a each into which an attaching screw 38 for attaching the semiconductor module 30A is screwed, is formed on the semiconductor module loading portion 21. A plurality of attaching posts 24 for attaching the control circuit board 40A thereto is stood, at the semiconductor module loading portion 21 and the power and signal connector mounting portion 22. A threaded hole 24a into which an attaching screw 41 for attaching the control circuit board 40A is screwed, is formed on each of the attaching posts 24. Furthermore, a plurality of threaded holes 23a each into which an attaching screw 61 for attaching the three-phase-output connector 60 is screwed, is formed on the three-phase-output connector mounting portion 23.

Figure 4:
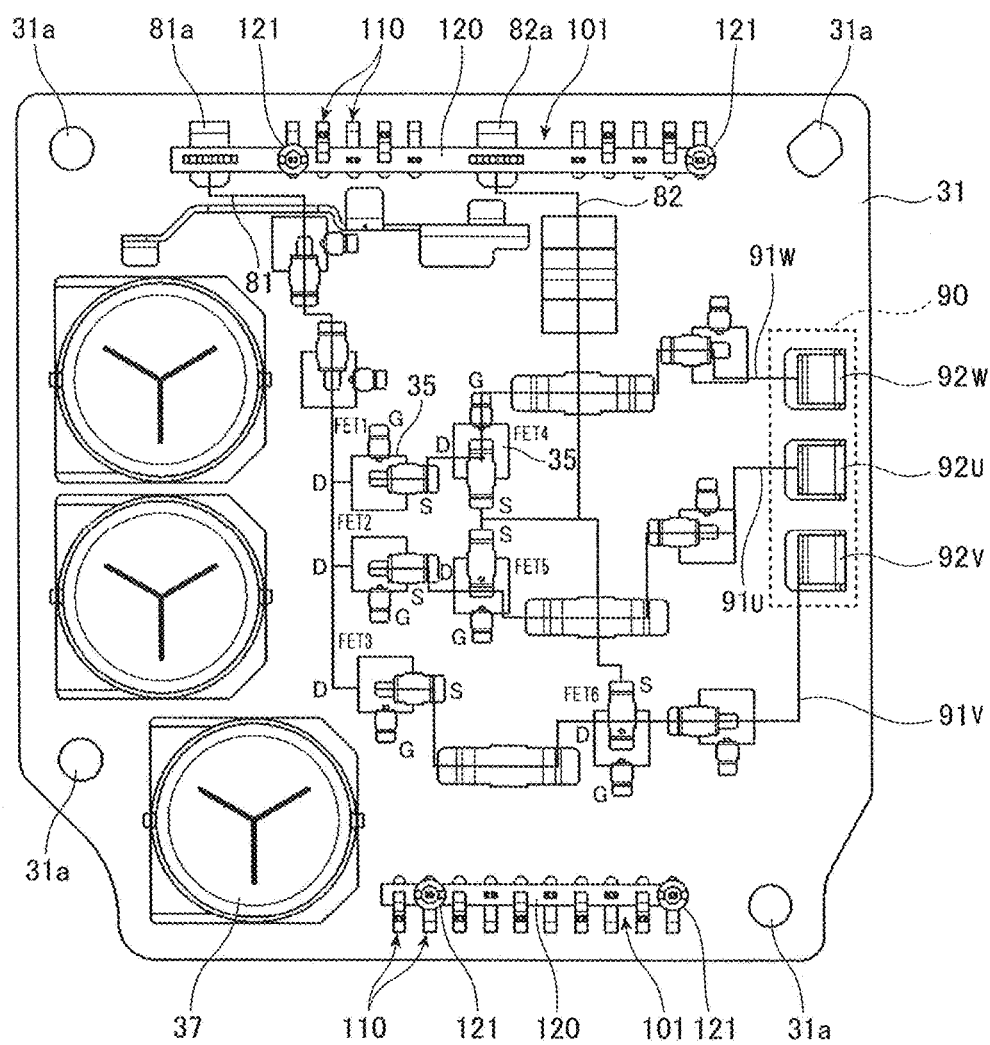
FIG. 4 is a top view of a semiconductor module of the ECU.

The semiconductor module 30A is a power circuit board, and has the circuit configuration of the motor driving section 105 described above. As shown in FIG. 4, the six FETs 1 to 6, a positive electrode terminal 81a coupled to a power source, and a negative electrode terminal 82a grounded through the current detecting circuit 114, are mounted on a board 31. Note that, each of the FETs 1 to 6 includes a bare chip FET (a bare chip transistor) 35. Together with a three-phase output unit 90 for outputting to each phase of the three-phase motor 200, a different surface mounting parts 37 including a capacitor is mounted on the board 31. Furthermore, plural through-holes 31a each through which the attaching screw 38 for attaching the semiconductor module 30A to the case 20 is inserted, is also provided to the board 31 of the semiconductor module 30A.

The control circuit board 40A comprises a control circuit including the control calculating section 108 and the gate driving section 109 with plural electronic parts mounted on the board. The control circuit board 40A is attached with the plural attaching screws 41 onto the plural attaching posts 24 stood at the semiconductor module loading portion 21 and the power and signal connector mounting portion 22, from the upper side of the semiconductor module 30A. Plural through-holes 40a through which the plural attaching screws 41 for the attachment is inserted, are formed through the control circuit board 40A.

As shown in FIGS. 3 and 4, the plural multipolar lead parts 101 are mounted on the semiconductor module 30A, and the semiconductor module 30A and the control circuit board 40A are mutually coupled through the multipolar lead parts 101.

Here, the multipolar lead parts 101 according to the present invention will be described.

Figure 5:
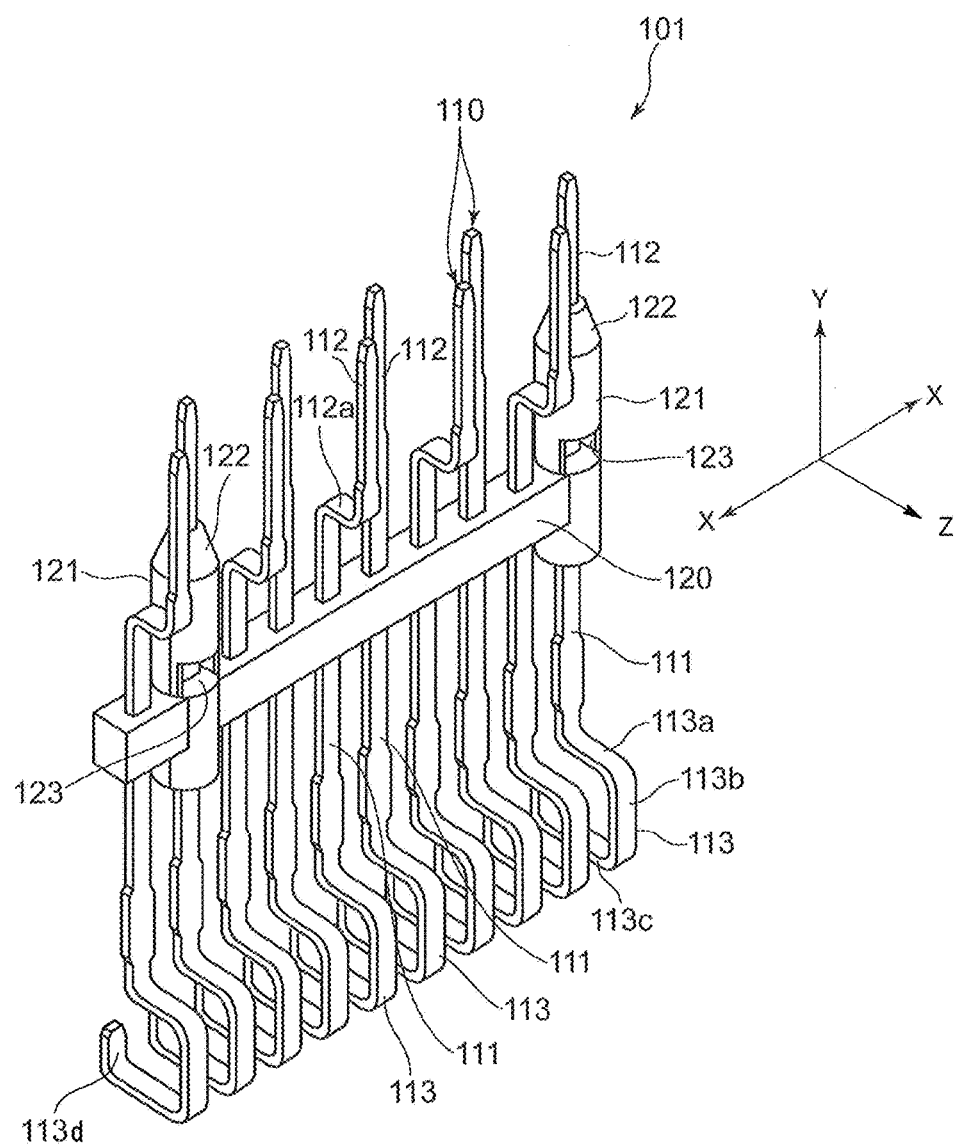
FIG. 5 is a perspective view of the multipolar lead parts.
Figure 6A:
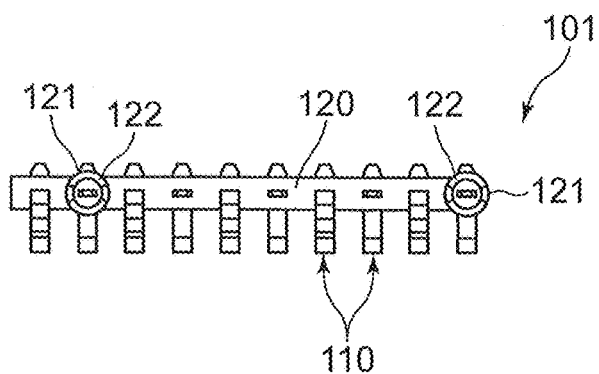
FIGS. 6A, 6B and 6C are a plan view, a front view, and a bottom view of the multipolar lead parts in FIG. 5, respectively.
Figure 6B:
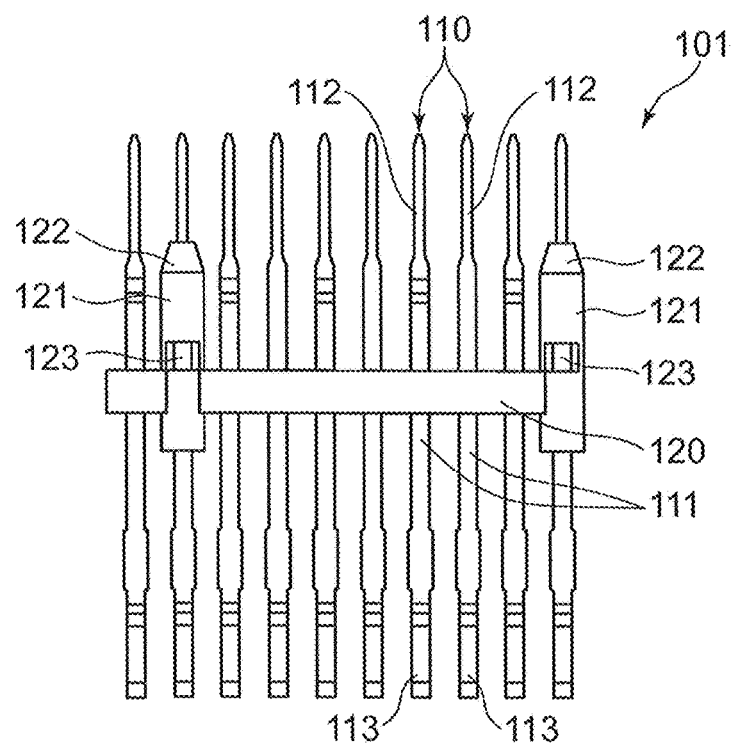
Figure 6C:
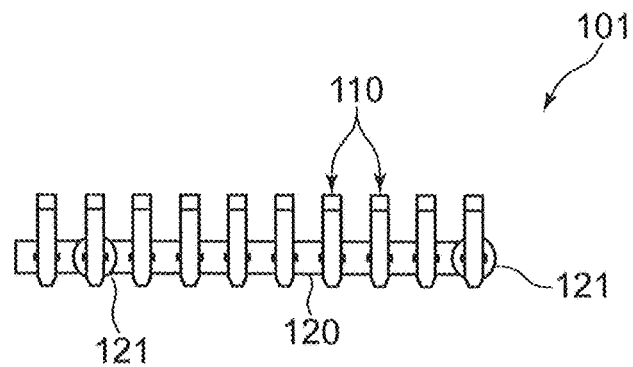
Figure 7A:
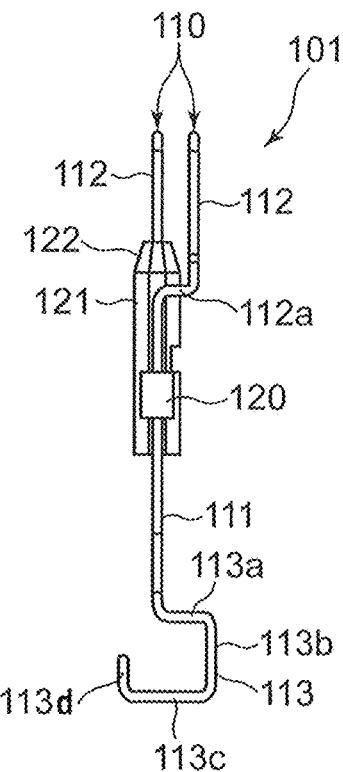
FIGS. 7A and 7B are a left side view and a right side view of the multipolar lead parts in FIG. 5, respectively.
Figure 7B:
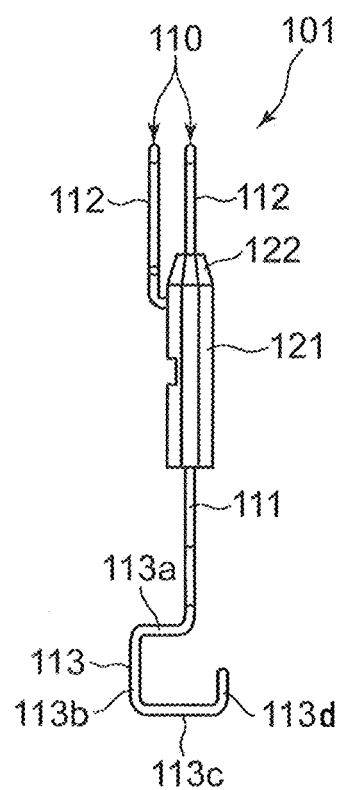

FIG. 5 is a perspective view of one of the embodiments of the multipolar lead parts according to the present invention. FIGS. 6A, 6B and 6C are a plane view, a front view, and a bottom view of the multipolar lead parts 101 illustrated in FIG. 5, respectively. FIGS. 7A and 7B are a left side view and a right side view, respectively.

As shown in FIG. 5, the multipolar lead parts 101 according to the present invention include plural connector pins (leads) 110 and a retaining member 120.

The plural leads 110 are arranged in a line with a predetermined pitch in a direction indicated with an arrow X orthogonal to a coupling direction with respect to, for example, the board, indicated with an arrow Y in FIG. 5 (note that, here, a direction orthogonal to the X and Y is defined as a Z-direction). Each of the leads 110 is formed by performing punching and bending to a metal plate, and extends in the coupling direction. When each constituent portion of each of the leads 110 is broadly classified, a retaining portion 111 retained by the retaining member 120, an upper-side board coupling portion (a through-hole coupling portion) 112 extending from an upper end of the retaining portion 111 in the coupling direction so as to be coupled to, for example, a through-hole of the upper-side board, and a lower-side board coupling portion (a surface mount coupling portion) 113 extending from a lower end of the retaining portion 111 in the coupling direction, to be coupled to the lower-side board, are comprised.

Here, the through-hole coupling portion 112 is, for example, inserted through the through-hole 42 formed through the control circuit board 40A as shown in FIG. 3 and then is soldered so as to be coupled. According to the present embodiment, there are two types for the leads 110. That is, one is the through-hole coupling portion 112 extending straight upward from the upper end of the retaining portion 111 in the coupling direction, and the other is the through-hole coupling portion 112 extending upward through a bending portion 112a once bent from the upper side of the retaining portion 111 in the coupling direction toward the front side.

The leads 110 each including the through-hole coupling portion 112 extending straight and the leads 110 each including the through-hole coupling portion 112 extending through the bending portion 112a, are alternately arranged in the direction indicated with the arrow X orthogonal to the coupling direction indicated with the arrow Y. In this manner, the through-hole coupling portion 112 extending straight and the through-hole coupling portions 112 extending through the bending portion 112a are alternately arranged so that the through-hole coupling portions 112 are formed in two lines in the direction orthogonal to the coupling direction. In the two lines, the through-hole coupling portions 112 extending straight and the through-hole coupling portion 112 extending through the bending portions 112a are arranged to be staggered (alternation back and forth). As a result, a high-density arrangement can be achieved.

The surface mount coupling portion 113 of each of the leads 110 is surface-mounted on a conductive pad (not shown) on the board 31 in the semiconductor module 30A as shown in FIG. 3 and then is soldered by, for example, a reflow method so as to be coupled. Each of the surface mount coupling portions 113 have a forward protruding portion 113a once extending forward from the lower end of the retaining portion 111 in the coupling direction, a vertical portion 113b extending downward from a front end of the forward protruding portion 113a, a solder coupling portion 113c extending backward from a lower end of the vertical portion 113b, to be soldered and be coupled to the conductive pad, and a rising portion 113d extending upward from an end of the solder coupling portion 113c.

Figure 8A:
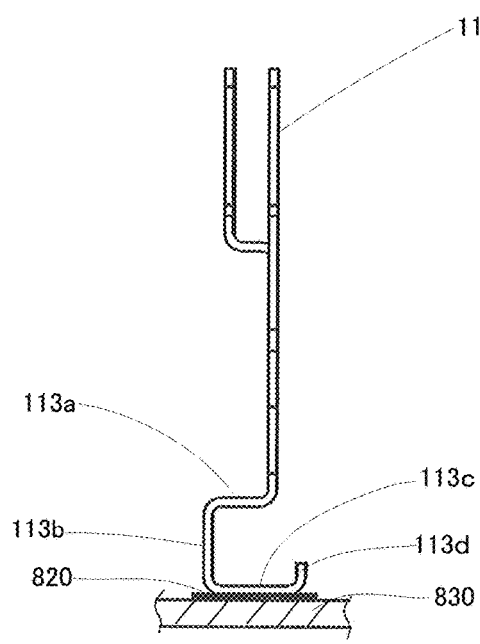
FIGS. 8A and 8B are side views of a rising portion of a lead before and after reflow processing, respectively.
Figure 8B:
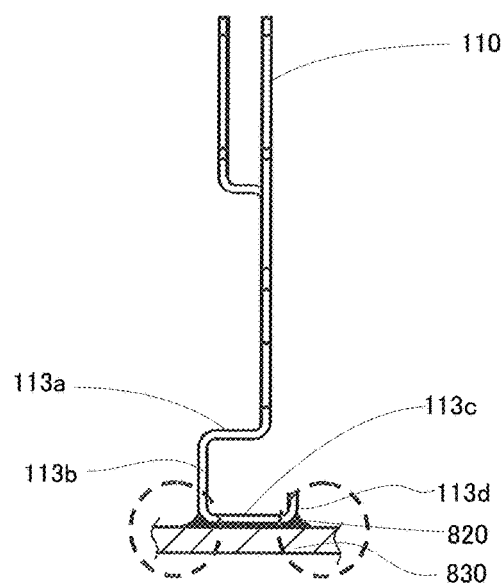
Figure 20A:
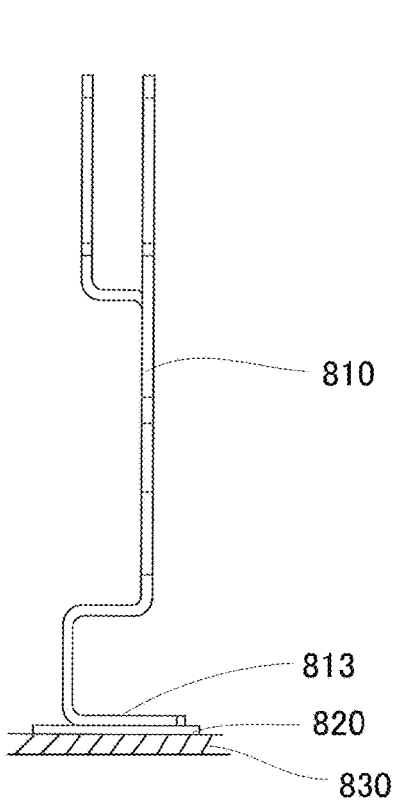
FIGS. 20A and 20B are side views of a conventional lead before and after the reflow processing, respectively.
Figure 20B:
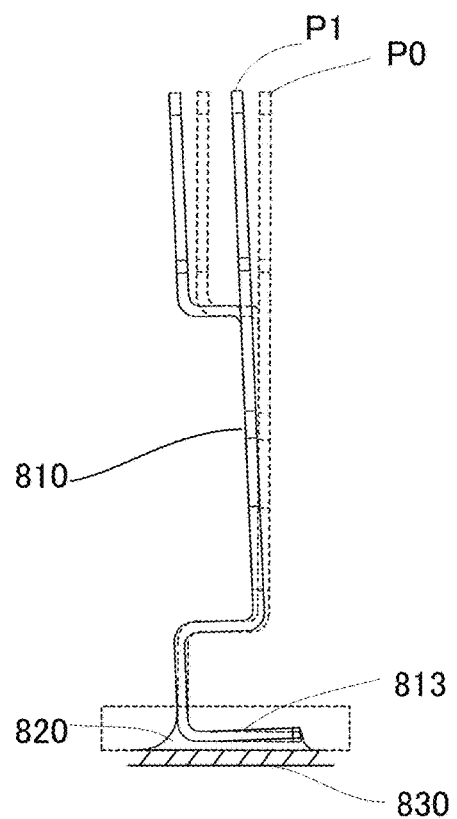

Here, as illustrated in FIG. 8A, the rising portion 113d is formed so as to have a bending angle of the rising portion 113d with respect to the solder coupling portion 113c, substantially the same as a bending angle of each of the leads 110 formed ranging from the vertical portion 113b to the solder coupling portion 113c, with respect to the solder coupling portion 113c. As a result, the leads 110 are formed to be included in a mode in which both-end portions of the solder coupling portion 113c are mutually symmetric when viewed from an intermediate portion of the solder coupling portion 113c. Therefore, as shown in a dotted line of FIG. 8B, in a case where the solder coupling portion 113c has been soldered, a region in which solder paste 820 that has melted adheres to each of the leads 110, has substantially uniformity at both of the ends of the solder coupling portion 113c. Consequently, a tension caused by the solder paste 820 that has melted, becomes uniform at both of the ends of the solder coupling portion 113c with respect to the outside of the rising portion 113d (a direction of the side opposite to the side of the solder coupling portion 113c when viewed from the rising portion 113d) and the outside of the vertical portion 113b (a direction of the side opposite to the side of the solder coupling portion 113c when viewed from the vertical portion 113b). Therefore, the position aberration shown in FIG. 20B caused before and after the soldering, can be retained at the minimum with respect to the coupling direction of the leads 110.

Further, the retaining member 120 is a member with a rectangular section, extending in the direction indicated with the arrow X orthogonal to the coupling direction indicated with the arrow Y, and is formed by molding insulating resin. The retaining member 120 retains the plural leads 110 with the predetermined pitch. In this manner, the retaining member 120 retains the plural leads 110 so that the through-hole coupling portion 112 and the surface mount coupling portion 113 of each of the leads 110 can be positioned.

Furthermore, protective portions 121 each protecting a specific lead 110 out of the plural leads 110, are provided to portions of the retaining member 120 in the extending direction. The protective portions 121 each extend to protrude from the retaining member 121 in the coupling direction of the leads 110 being protected, and cover the periphery of the leads 110.

The protective portions 121 will be concretely described. The protective portions 121 are disposed at one end portion of the retaining member 120 in the extending direction and a portion apart from the one end portion at a predetermined distance, the portion being inside the other end portion of the retaining member 120. The two protective portions 121 individually protect the lead 110 positioned at the one end outside (including the through-hole coupling portion 112 extending straight upward from the upper end of the retaining portion 111 in the coupling direction) and the other lead 110 apart from the lead 110 at the predetermined distance, inside a pin terminal at the other end outside (specifically, including another pin terminal adjacent to the pin terminal at the other end outside and the through-hole coupling portion 112 extending straight upward from the upper end of the retaining portion 111), out of the plural leads 110 formed in the line. The two protective portions 121 are cylindrically formed so as to cover the peripheries of the leads 110, extending to protrude from the retaining portion 120 in the coupling direction of the leads 110.

The protruding amount of each of the protective portions 121 from the retaining portion 120 has a degree in which the through-hole coupling portion 112 is exposed and can be inserted through the through-hole 42 of the control circuit board 40A so as to be coupled at the maximum. The two protective portions 121 are integrally molded with the retaining member 120. Accordingly, the two protective portions 121 can be manufactured together with the retaining member 120 by a simple manufacturing process.

An incline surface 122 is formed at a leading end of each of the protective portions 121 in the coupling direction. Accordingly, even in a case where each of the leads 110 receives a bending load, for example, during assembly, a stress can be prevented from concentrating in a boundary between each of the leads 110 and the protective portion 121.

Further, the retaining member 120 and the protective portions 121 are formed together with the plural leads 110 by an insert molding. Accordingly, the multipolar lead parts 101 can be manufactured by a simple manufacturing process.

In addition, an opening 123 for a presser foot fixture (a pressure jig) that suppresses a deformation of the lead 110 to be protected during the insert molding method, is formed at a side portion of each of the protective portions 121. Accordingly, the presser foot fixture presses the leads 110 through the opening 123 during the insert molding so that the deformation of the lead 110 can be prevented.

Next, referring back to the configuration of the control unit 30 and continuing the descriptions, the power and signal connector 50 as shown in FIG. 3 is used in order to input direct current power from a battery (not shown) to the semiconductor module 30A and in order to input various signals including signals from the torque sensor 10 and the vehicle speed sensor 12 to the control circuit board 40A. As shown in FIG. 3, the power and signal connector 50 is attached with plural attaching screws 51 to the power and signal connector mounting portion 22 provided to the semiconductor module loading portion 21.

The three-phase-output connector 60 is used for outputting the three-phase current toward the motor 200.

As shown in FIG. 3, the three-phase-output connector 60 is attached with the plural attaching screws 61 to the three-phase-output connector mounting portion 23 provided to the end portion of the semiconductor module loading portion 21 in the width direction. Plural through-holes 60a through which the attaching screws 61 are inserted are formed through the three-phase-output connector 60.

Furthermore, as shown in FIG. 3, the cover 70 is attached to the case 20 including the semiconductor module 30A, the control circuit board 40A, the power and signal connector 50, and the three-phase-output connector 60 attached thereto, so as to cover the control circuit board 40A from the upper side of the control circuit board 40A.

Next, a method of attaching the semiconductor module 30A and the control circuit board 40A to the case 20, will be described in detail.

First, as shown in FIG. 3, the semiconductor module 30A mounted the multipolar lead parts 101 is attached with the plural attaching screws 38 onto the semiconductor module loading portion 21 of the case 20.

Then, in mounting the multipolar lead parts 101 on the semiconductor module 30A, the surface mount coupling portions 113 of each of the plural leads 110 is soldered and coupled to the conductive pad on the board 31. In performing the solder, as described above, both of the end portions of the solder coupling portion 113d of the surface mount coupling portions 113 is formed so as to be substantially symmetric so that the position aberration of each of the leads 110 in the coupling direction can be suppressed at the minimum.

Further, the heat dissipating sheet 39 is attached onto the semiconductor module loading portion 21 and then the semiconductor module 30A is attached from the upper side of the heat dissipating sheet 39 before the semiconductor module 30A is attached onto the semiconductor module loading portion 21. The heat dissipating sheet 39 dissipates a heat generated in the semiconductor module 30A to the case 20 through the heat dissipating sheet 39.

After the semiconductor module 30A equipped the multipolar lead parts 101 is mounted on the semiconductor module loading portion 21, the control circuit board 40A is attached with the plural attaching screws 41 onto the plural attaching posts 24 stood at the semiconductor module loading portion 21 and the power and signal connector mounting portion 22, from the upper side of the semiconductor module 30A. Accordingly, the semiconductor module 30A and the control circuit board 40 can be attached to the case 20.

During the attachment, the through-hole coupling portion 112 of each of the leads 110 of the multipolar lead parts 110 being mounted on the semiconductor module 30A, is inserted through each of the through-holes 42 of the control circuit board 40A so as to be soldered and be coupled.

Here, since the retaining member 120 retains the plural leads 110 with the predetermined pitch, the positioning of the through-hole coupling portion 112 of each of the leads 110 has been performed in advance. Accordingly, the through-hole coupling portion 112 of each of the leads 110 is appropriately and smoothly inserted through each of the through-holes 42 of the control circuit board 40A.

The other hand, meanwhile, since each of the leads 110 is typically formed by slenderly extending the metal plate in the coupling direction, some external force may cause the deformation during the assembly. Therefore, when the external force acts on the specific lead 110 out of the plural leads 110 and then the deformation occurs, not only position aberration of the lead 110 occurs but also position aberration of the other leads 110 occurs through the retaining member 120.

In contrast to this, the multipolar lead parts 101 according to the present embodiment includes the protective portions 121 disposed at the one end portion of the retaining member 120 in the extending direction and the portion apart from the one end portion at the predetermined distance, the portion being inside the other end portion of the retaining member 120, so that the two protective portions 121 protect the leads 110 positioned at the one end outside and the other leads 110 apart from the lead 110 at the predetermined distance, inside the lead 110 at the other end outside, out of the plural leads 110 formed in the line. Accordingly, the protective portions 121 can protect the leads 110 positioned at the one end outside, on which the external force most easily acts during the coupling to the circuit board or during conveying of the multipolar lead parts 101, and the other leads 110 apart from the leads 110 at the predetermined distance, inside the leads 110 at the other end outside, out of the plural leads 110 arranged in the line. Accordingly, even when some external force acts on the leads 110 positioned at the one end outside and the other leads 110 apart from the leads 110 at the predetermined distance, inside the leads 110 at the other end outside, the deformations can be prevented from occurring in the leads 110 and the position aberration of the leads 110 can be prevented. In addition, the position aberration of the other leads 110 due to the deformations of the leads 110 can be prevented. Accordingly, the leads 110 of the multipolar lead parts 101 can be appropriately and smoothly inserted through the through-holes 42 of the control circuit board 40A.

Further, each of the protective portions 121 is configured to cover the periphery of the through-hole coupling portion 112 and to protect the through-hole coupling portion 112. Accordingly, the deformation of the through-hole coupling portion 112 can be prevented and additionally the position aberration thereof can be prevented. In this way, the through-hole coupling portion 112 can be appropriately and smoothly inserted through the through-hole 42 of the control circuit board 40.

Therefore, the through-hole coupling portion 112 of each of the leads 110 can be appropriately and smoothly inserted through each of the through-holes 42 of the control circuit board 40A so that the through-hole coupling portion 112 can be stably soldered and coupled and additionally the variation of conductivity of each of the leads 110 can be suppressed.

Figure 9:
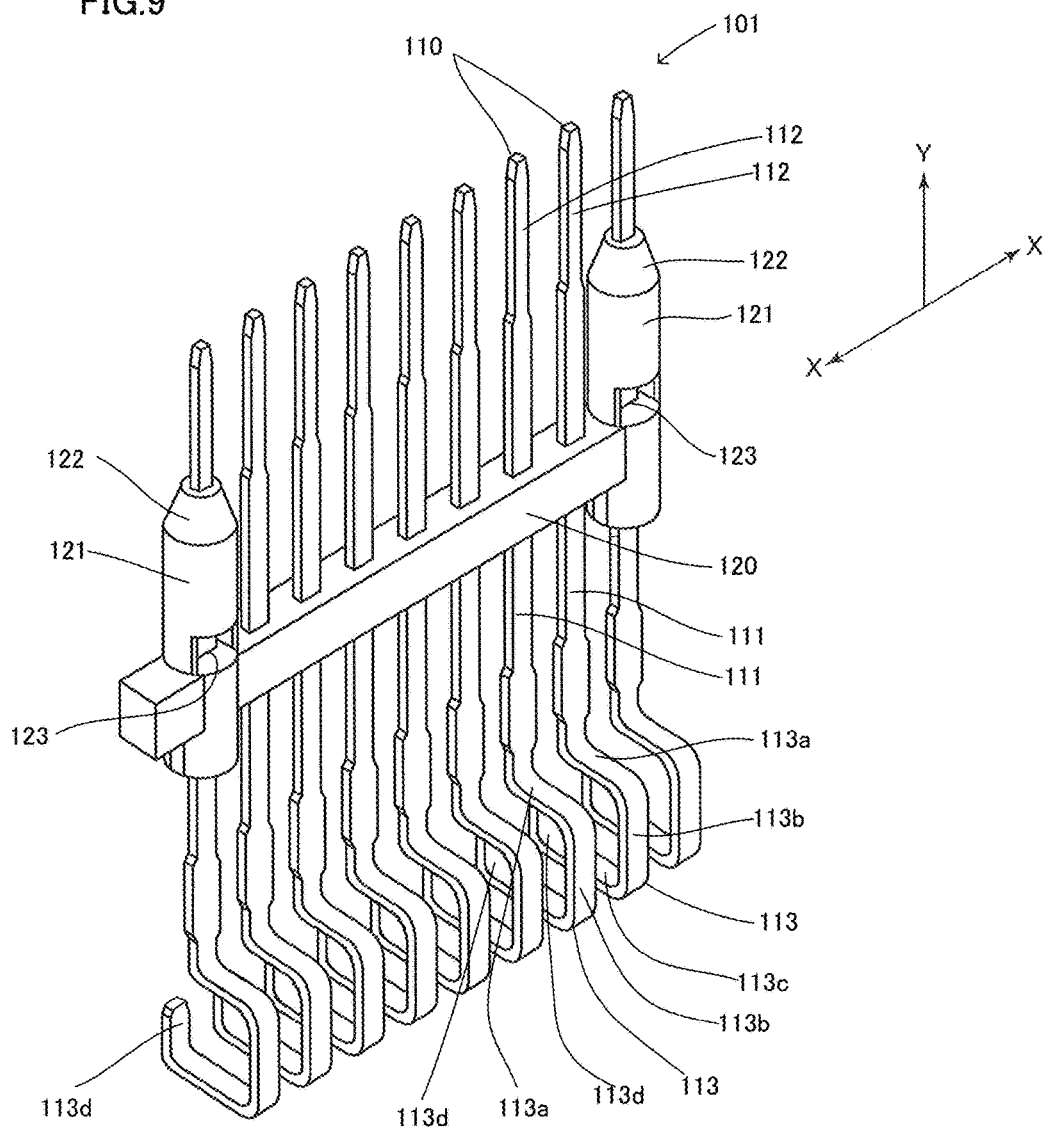
FIG. 9 is a perspective view of multipolar lead parts according to the first modification.
Figure 10A:
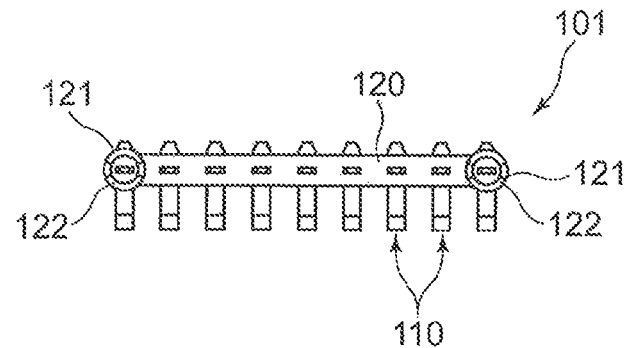
FIGS. 10A, 10B and 10C are a plan view, a front view, and a bottom view of the multipolar lead parts in FIG. 9, respectively.
Figure 10B:
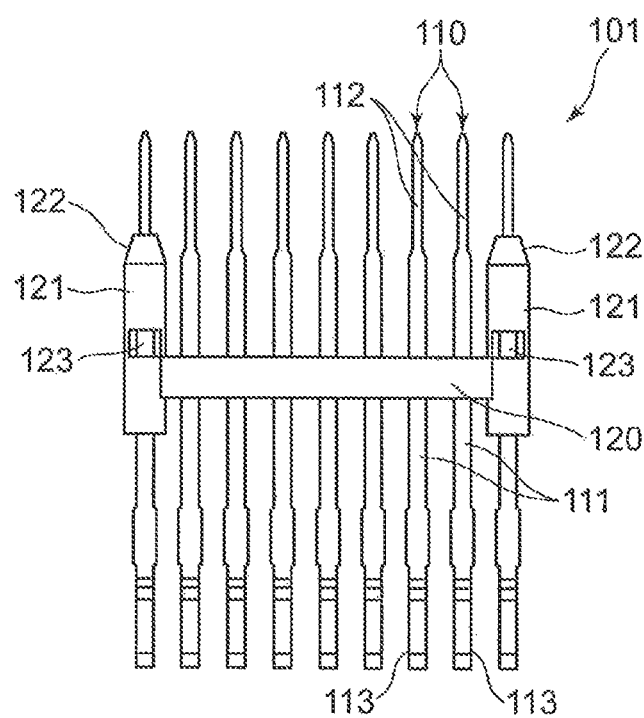
Figure 10C:
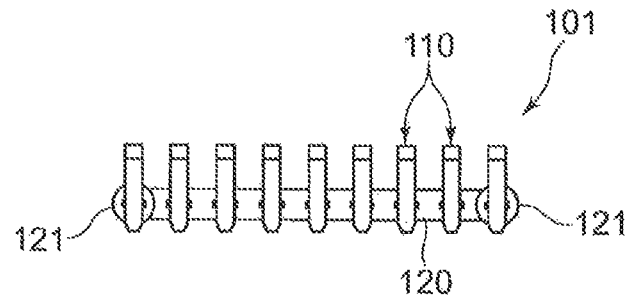
Figure 11:
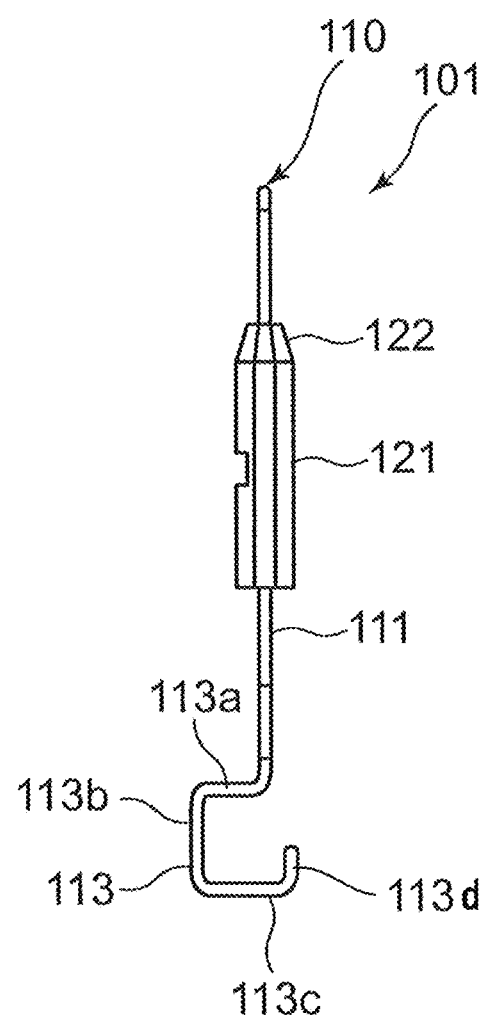
FIG. 11 is a right side view of the multipolar lead parts in FIG. 9.

Next, the multipolar lead parts 101 according to the first modification will be described with reference to FIGS. 9 to 11. FIG. 9 is a perspective view of the multipolar lead parts according to the first modification. FIGS. 10A, 10B and 10C illustrate the multipolar lead parts in FIG. 9, and are a plan view, a front view, and a bottom view, respectively. FIG. 11 is a right side view of the multipolar lead parts in FIG. 9. In FIGS. 9 to 11, members the same as the members illustrated in FIGS. 5 to 7B are denoted with the same reference signs and the descriptions thereof may be omitted.

The multipolar lead parts 101 shown in FIGS. 9 to 11 has a basic configuration the same as that of the multipolar lead parts 101 shown in FIGS. 5 to 7B, but is different in terms of the shape of the leads 110 and an arrangement position of a protective portion 121.

That is, the multipolar lead parts 101 illustrated in FIGS. 9 to 11, includes the plural leads 110 arranged with a predetermined pitch in a line in a direction indicated with the arrow X orthogonal to a coupling portion indicated with the arrow Y in FIG. 9. Each of the leads 110 is formed by performing punching and bending to a metal plate, and extends in the coupling direction. Each of the leads 110 includes a retaining portion 111 extending in the coupling direction, retained by a retaining member 120, a through-hole coupling portion 112 extending from an upper end of the retaining portion 111 in the coupling direction, and a surface mount coupling portion 113 extending from a lower end of the retaining portion 111 in the coupling direction.

Here, the through-hole coupling portion 112 is to be inserted through the through-hole 42 formed through the control circuit board 40A (refer to FIG. 3) so as to be soldered and be coupled. According to the first modification, the leads 110 belong to one type including the through-hole coupling portion 112 extending straight upward from the upper end of the retaining portion 111 in the coupling direction, differently from the leads 110 shown in FIG. 5 to FIGS. 7A and 7B.

Further, the surface mount coupling portion 113 of each of the leads 110 is surface-mounted on the conductive pad (not shown) on the board 31 in the semiconductor module 30A so as to be soldered and be coupled. Each of the surface mount coupling portions 113 comprises a forward protruding portion 113a once extending forward from the lower end of the retaining portion 111 in the coupling direction, a vertical portion 113b extending downward from a front end of the forward protruding portion 113a, a solder coupling portion 113c extending backward from a lower end of the vertical portion 113b, to be soldered and coupled to the conductive pad, and a rising portion 113d extending upward from an end of the solder coupling portion 113c.

Furthermore, the retaining member 120 is a member with a rectangular section, extending in a direction indicated with the arrow X orthogonal to the coupling direction indicated with the arrow Y, and is formed by molding the insulating resin. The retaining member 120 retains the plural leads 110 with the predetermined pitch. The retaining member 120 retains the plural leads 110 so that the through-hole coupling portion 112 and the surface mount coupling portion 113 of each of the leads 110 can be positioned.

Then, the protective portions 121 each protecting a specific lead 110 out of the plural leads 110, are provided to portions of the retaining member 120 in the extending direction. The protective portions 121 each extend to protrude from the retaining member 120 in the coupling direction of the leads 110 being protected, and cover the periphery of the leads 110. The protruding amount of each of the protective portions 121 from the retaining portion 120 has a degree in which the through-hole coupling portion 112 is exposed and can be inserted through the through-hole 42 of the control circuit board 40A so as to be coupled at the maximum. Each of the protective portions 121 is cylindrical in shape.

The protective portions 121 will be concretely described. The protective portions 121 are disposed at both-end portions of the retaining member 120 in the extending direction. The two protective portions 121 disposed at both of the end portions of the retaining member 120 in the extending direction, protect the leads 110 positioned at both ends outside out of the plural leads 110 formed in the line. According to the present embodiment, a pair of the multipolar lead parts 101 is provided on opposite sides of each of the boards (30A, 40A) being quadrangular in shape so as to be along the opposite sides. Ends of the cylindrical protective portions 121 of the leads 110 provided outermost in the line, support the other board.

The multipolar lead parts 101 according to the present embodiment, can protect the pin type terminals 110 positioned at both of the ends outside, on which the external force most easily acts during coupling to the control circuit board 40A or during conveying of the multipolar lead parts 101, out of the plural leads 110 arranged in the line, with the protective portions 121.

Accordingly, even when some external force acts on the leads 110 positioned at both of the ends outside, deformations of the leads 110 can be prevented from occurring and the position aberration of the leads 110 at both of the ends outside can be prevented. In addition, the position aberration of the other leads 110 due to the deformations of the leads 110 at both of the ends outside can be prevented. Consequently, the through-hole coupling portions 112 of the leads 110 of the multipolar lead parts 101 can be appropriately and smoothly inserted through the through-holes 42 of the control circuit board 40.

Each of the protective portions 121 is configured to cover the periphery of the through-hole coupling portion 112 of each of the leads 110 and to protect the through-hole coupling portion 112.

Accordingly, the deformation of the through-hole coupling portion 112 can be prevented and additionally the position aberration thereof can be prevented. In this way, the through-hole coupling portion 112 can be appropriately and smoothly inserted through the through-hole 42 of the control circuit board 40A.

Therefore, the through-hole coupling portion 112 of each of the leads 110 can be appropriately and smoothly inserted through each of the through-holes 42 of the control circuit board 40A so that the through-hole coupling portion 112 can be stably soldered and coupled and additionally the dispersion of conductivity of each of the leads 110 can be suppressed.

Figure 12A:
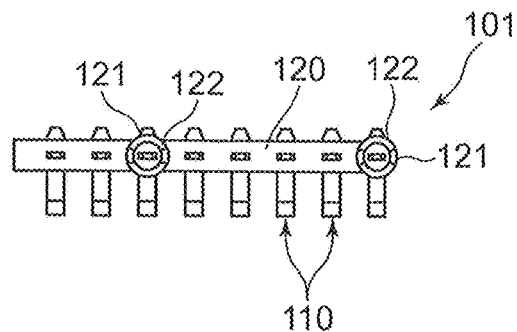
FIGS. 12A, 12B and 12C are a plan view, a front view, and a bottom view of the multipolar lead parts according to the second modification.
Figure 12B:
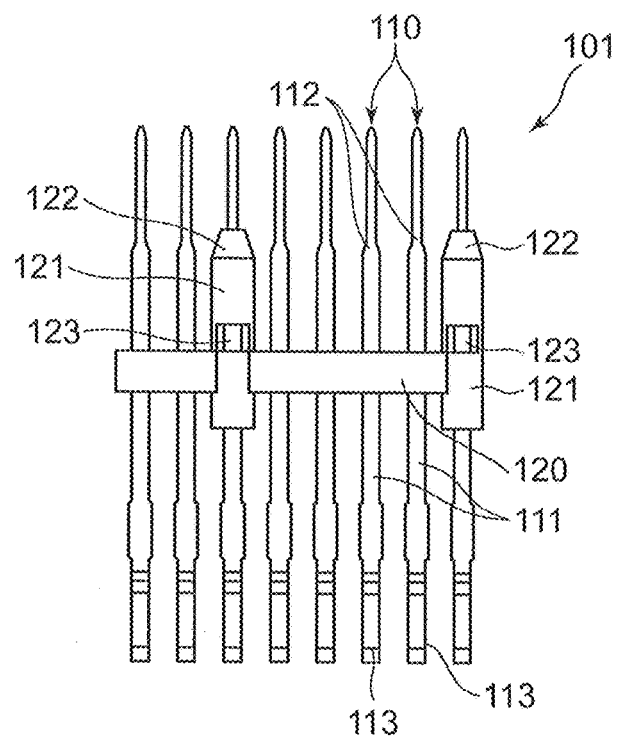
Figure 12C:
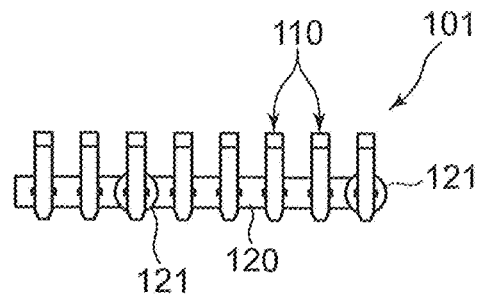
Figure 13A:
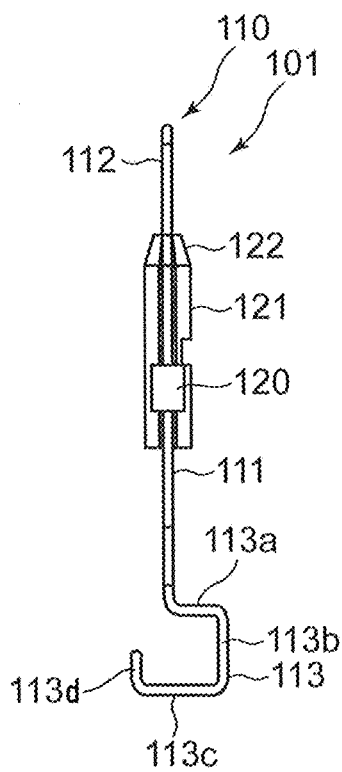
FIGS. 13A and 13B are a left side view and a right side view of the multipolar lead parts in FIG. 12.
Figure 13B:
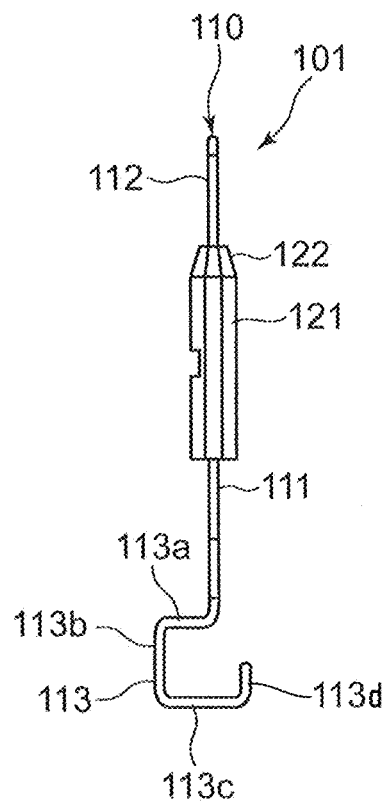
Figure 14A:
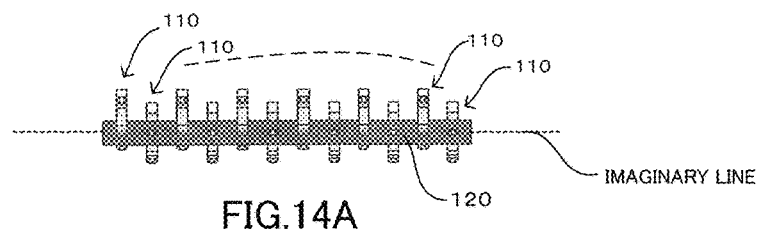
FIGS. 14A, 14B, 14C, 14D, 14E and 14F are a plan view, a front view, a bottom view, a left side view, a right side view, and a perspective view of the plural leads exemplarily arranged zigzag in an arrangement direction, respectively.
Figure 14D:
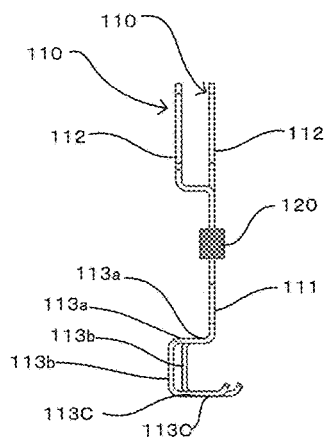
Figure 14B:
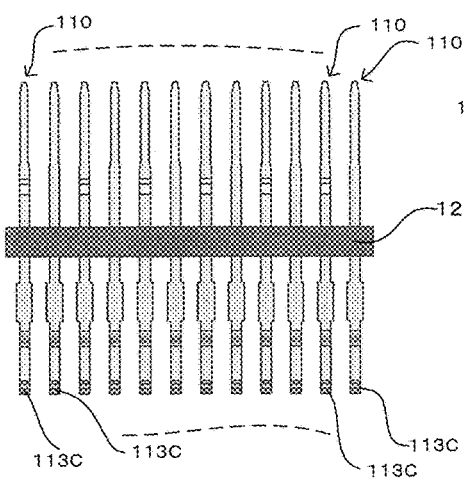
Figure 14E:
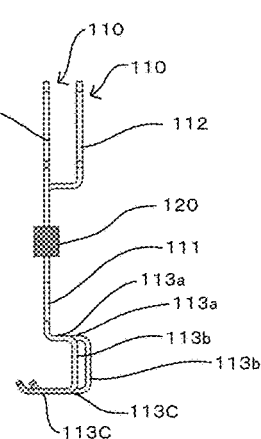
Figure 14C:
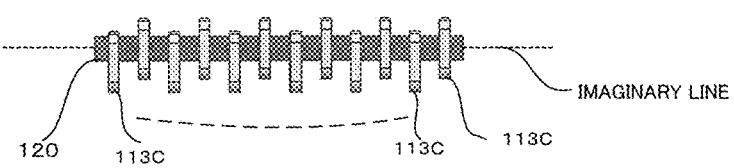
Figure 14F:
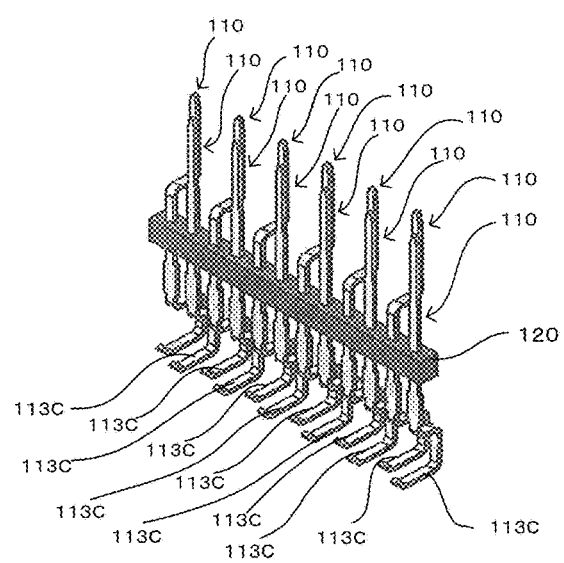

Next, the multipolar lead parts 101 according to a second modification will be described with reference to FIGS. 12A to 12C to FIGS. 13A and 13B. FIGS. 12A, 12B and 12C show the multipolar lead parts according to the second modification, and are a plane view, a front view, and a bottom view, respectively. FIGS. 13A and 13B show the multipolar lead parts in FIGS. 12A to 12C, and area left side view and a right side view, respectively. In FIGS. 12A to 13B, members the same as the members shown in FIGS. 5 to 7B are denoted with the same reference signs, and the descriptions thereof may be omitted.

The multipolar lead parts 101 shown in FIGS. 12A to 13B has a basic configuration the same as that of the multipolar lead parts 101 shown in FIGS. 9 to 11, but is different in terms of an arrangement position of a protective portion 121.

That is, in the multipolar lead parts 101 shown in FIGS. 12A to 13B, the plural leads 110 are arranged with a predetermined pitch in a line in a direction orthogonal to a coupling direction. Each of the leads 110 is formed by performing the punching and the bending to a metal plate, and extends in the coupling direction. Each of the leads 110 comprises a retaining portion 111 extending in the coupling direction, retained by a retaining member 120, a through-hole coupling portion 112 extending from an upper end of the retaining portion 111 in the coupling direction, and a surface mount coupling portion 113 extending from a lower end of the retaining portion 111 in the coupling direction.

Here, the through-hole coupling portion 112 is to be inserted through the through-hole 42 formed through the control circuit board 40A (refer to FIG. 3) so as to be soldered and be coupled. According to the second modification, the leads 110 belong to the one type, similarly to the leads 110 shown in FIGS. 9 to 11. The through-hole coupling portion 112 of each of the leads 110 extends straight upward from an upper end of the retaining portion 111 in the coupling direction.

Further, the surface mount coupling portion 113 of each of the leads 110 is surface-mounted on the conductive pad (not shown) on the board 31 in the semiconductor module 30A so as to be soldered and be coupled. Each of the surface mount coupling portions 113 comprises the forward protruding portion 113a once extending forward from the lower end of the retaining portion 111 in the coupling direction, the vertical portion 113b extending downward from a front end of the forward protruding portion 113a, the solder coupling portion 113c extending backward from a lower end of the vertical portion 113b, to be soldered and coupled to the conductive pad, and the rising portion 113d extending upward from an end of the solder coupling portion 113c.

Furthermore, the retaining member 120 is a member with a rectangular section, extending in a direction orthogonal to the coupling direction, and is formed by molding the insulating resin. The retaining member 120 retains the plural leads 110 with the predetermined pitch. The retaining member 120 retains the plural leads 110 so that the through-hole coupling portion 112 and the surface mount coupling portion 113 of each of the leads 110 can be positioned.

Then, the protective portions 121 each protecting a specific lead 110 out of the plural leads 110, are provided to portions of the retaining member 120 in the extending direction. The protective portions 121 each extend to protrude from the retaining member 120 in the coupling direction of the lead 110 being protected, and cover the periphery of the lead 110. Each of the protective portions 121 is cylindrical in shape. The protruding amount of each of the protective portions 121 from the retaining portion 120 has a degree in which the through-hole coupling portion 112 is exposed and can be inserted through the through-hole 42 of the control circuit board 40A so as to be coupled at the maximum.

The protective portions 121 will be further concretely described. The protective portions 121 are different from the protective portions 121 shown in FIGS. 9 to 11 and the protective portions 121 are disposed at one end portion of the retaining member 121 in the extending direction and a portion apart from the one end portion at a predetermined distance, the portion being inside the other end portion of the retaining member 121. The two protective portions 121 protect the lead 110 positioned at one end outside and the other lead 110 apart from the lead 110 at a predetermined distance, inside a lead 110 at the other end outside (specifically, being second inside from the lead 110 at the other end outside), out of the plural leads 110 formed in the line.

The multipolar lead parts 101 according to the present embodiment, can protect the lead 110 positioned at the one end outside, on which external force most easily acts during the coupling to the control circuit board 40A or during conveying of the multipolar lead parts 101, and the other lead 110 apart from the lead 110 at the predetermined distance, inside the lead 110 positioned at the other end outside, with the protective portions 121, out of the plural leads 110 arranged in the line. Therefore, even when the some external force acts on the lead 110 positioned at the one end outside and the other lead 110 apart from the lead 110, inside the lead 110 at the other end outside, the deformations of the leads 110 can be prevented from occurring and the position aberration of the leads 110 can be prevented. In addition, the position aberration of the other leads 110 due to the deformations of the leads 110 can be prevented. Thus, the leads 110 of the multipolar lead parts 101 can be appropriately and smoothly inserted through the through-holes 42 of the control circuit board 40A.

Each of the protective portions 121 is made to cover the periphery of the through-hole coupling portion 112 and to protect the through-hole coupling portion 112. Accordingly, a deformation of the through-hole coupling portion 112 can be prevented and additionally a position aberration thereof can be prevented. Accordingly, the through-hole coupling portion 112 can be appropriately and smoothly inserted through the through-hole 42 of the control circuit board 40A.

Therefore, the through-hole coupling portion 112 of each of the leads 110 can be appropriately and smoothly inserted through each of the through-holes 42 of the control circuit board 40A so that the through-hole coupling portion 112 can be stably soldered and coupled and additionally the dispersion of conductivity of each of the leads 110 can be suppressed.

The embodiments of the present invention have been described. The present invention is not limited to the above embodiments, and various alterations and improvements may be made.

In this connection, for example, the plural leads 110 arranged in the direction orthogonal to the coupling direction, are not limited to the line and may be arranged in plural lines.

Further, for example, the plural leads 110 arranged in the direction orthogonal to the coupling direction, can constitute the solder coupling portions 113c included in the surface mount coupling portions (the lower-side board coupling portions) 113 of the leads 110, arranged zigzag in the arrangement direction of the leads 110, as shown in FIGS. 14A to 14F.

That is, here, FIGS. 14A, 14B, 14C, 14D, 14E and 14F show exemplary zigzag arrangement of the plural leads in the arrangement direction as described above, and are a plane view, a front view, a bottom view, a left side view, a right side view and a perspective view, respectively. Here, the zigzag arrangement of the solder coupling portions 113c means that the solder coupling portions 113c of the leads 110 are alternately shifted so as to protrude at a regular interval in an imaginary direction (a Z-direction) on both sides of an imaginary line when the arrangement direction (an X-direction) is virtually expressed to be one line as indicated with a dotted line in the figure in a case where the plural leads 110 is arranged as described in FIGS. 14A to 14F.

For the purpose, in a case where the plural leads 110 are arranged so as to include the solder coupling portions 113c of the leads arranged zigzag as described above, the solder coupling portions 113c are arranged so as to be further apart from the imaginary line in a case where the plural leads 110 are arranged, in the Z-direction. Therefore, a lower-side projected area of the entirety of the plural leads 110 enlarges in a direction orthogonal to the imaginary line. As a result, the stability of the surface mount coupling portions (the lower-side board coupling portions) 113 increases and a synergistic effect with, for example, the retaining member 120 described above can further effectively prevent the position aberration of the multipolar lead parts.

Besides, here, the configuration of the leads 110 for arranging the solder coupling portions 113c zigzag is not particularly limited, and an arbitrary configuration can be applied thereto. Therefore, for example, a configuration comprising the lengths of the forward protruding portions 113a of the leads 110 adjacent to each other (or the lengths of the solder coupling portions 113c, for example) provided mutually long and short, or a configuration comprising appropriate angles alternately provided between the forward protruding portions 113a and the vertical portions 113b of the leads 110 adjacent to each other, is provided so that the zigzag arrangement can be achieved. Similarly, the mode of the through-hole coupling portion 112 may extend straight upward from the upper end of the retaining portion 111 in the coupling direction or may extend upward through the bending portion 112a once bent forward from the upper end of the retaining portion 111 in the coupling direction.

As a further different developed example, a method of arranging a protective portion 121, is not limited to the case where the two protective portions 121 shown in FIGS. 5 to 7B and FIGS. 12A to 13B protect the lead 110 positioned at the one end outside and the other lead 110 apart from the lead 110 at the predetermined distance, inside the lead 110 at the other end outside, out of the plural leads 110 formed in the line, and the case where the two protective portions 121 shown in FIGS. 9 to 11 protect the leads 110 positioned at both of the ends outside, out of the plural leads 110 formed in the line, but may provide a protective portion 121 at a portion of the retaining member 120 and the protective portion 121 may retain a specific lead 110 out of the plural leads 110.

The protective portion 121 is provided to the portion of the retaining member 120 and the protective portion 121 protects the specific lead 110 out of the plural leads 110 so that the protective portion 121 can protect the specific lead 110 during the coupling to the control circuit board 40A or during the conveying of the multipolar lead parts 101 and the deformation of the lead 110 can be prevented from occurring even when the some external force acts on the lead 110. Accordingly, the position aberration of the specific lead 110 can be prevented and additionally the position aberration of the other leads 110 due to the deformation of the specific lead 110 can be prevented. In this way, the leads 110 of the multipolar lead parts 101 can appropriately and smoothly inserted through the through-holes 42 of the control circuit board 40A.

The number of the protective portions 121 may be arbitrary, and all the leads 110 may be made to be protected.

When at least extending so as to protrude from the retaining member 120 in the coupling direction of the lead 110 being protected and cover the periphery of the lead 110, the protective portion 121 is not necessarily required to be cylindrical in shape.

Further, the incline 122 is not necessarily required to be formed at the leading end of the protective portion 121 in the coupling direction.

Furthermore, the retaining member 120 and the protective portion 121 are not necessarily required to be formed by the insert molding together with the plural leads 110.

The protective portion 121 is not necessarily required to have the opening 123 for the presser foot fixture that suppresses the deformation of the lead 110 during the insert molding.

According to the embodiments, the bending angle of the rising portion 113d of the surface mount coupling portion 113 of each of the leads 110, with respect to the solder coupling portion 113c is formed so as to be the same as the bending angle of each of the leads 110 formed ranging from the vertical portion 113b to the solder coupling portion 113c, with respect to the solder coupling portion 113c.

Therefore, according to the embodiments, the rising portion 113d substantially, vertically rises from the solder coupling portion 113c with respect to the board in practice.

However, the rising portion 113d according to the present invention, is provided in order to prevent each of the leads 110 from inclining from the coupling direction when an outside portion near a curve formed ranging from the vertical portion 113b to the solder coupling portion 113c, receives the tension caused by the solder paste 820 that has been melted, in a case where the solder coupling portion 113c is coupled with the solder paste 820 that has been melted.

Therefore, when the solder paste 820 that has been melted similarly acts on, in magnitude, an outside portion near a curve formed ranging from the solder coupling portion 113c to the rising portion 113d and an outside portion near a curve ranging from the lower side of the vertical portion 113b of each of the leads 110 to the solder coupling portion 113c, or when a difference can be cancelled so as to be the same in magnitude even in a case where the solder paste 820 differently acts on both of the outside portions in magnitude, the bending angle of the rising portion 113d with respect to the solder coupling portion 113c is not required to be formed substantially the same as the bending angle of each of the leads 110 with respect to the solder coupling portion 113c, as described above.

Therefore, for example, altering the rising angle, an area, or weight distribution of the rising portion 113d causes the solder paste 820 that has been melted, to act on the rising portion 113d in magnitude similarly to the outside portion near the curve ranging the lower side of the vertical portion 113b of each of the leads 110 to the solder coupling portion 113c, or a difference is cancelled so as to be the same in magnitude even in a case where the solder paste 820 differently acts on both of the outside portions, so that a configuration of preventing each of the leads 110 from inclining from the coupling direction can be provided.

Figure 15A:
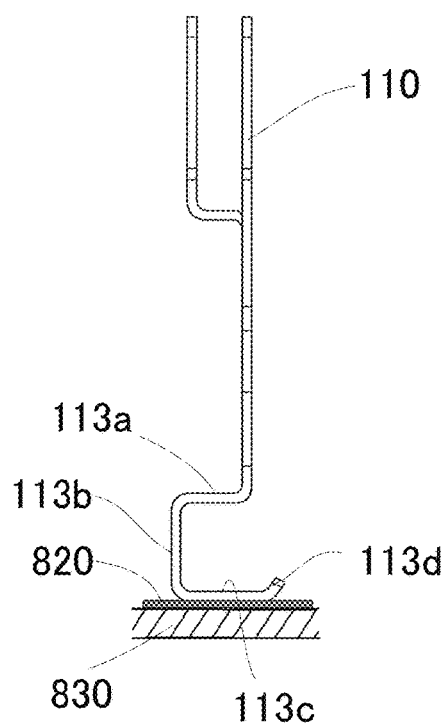
FIGS. 15A and 15B are side views of a mode in which the rising portion smoothly rises, before and after the reflow processing, respectively.
Figure 15B:
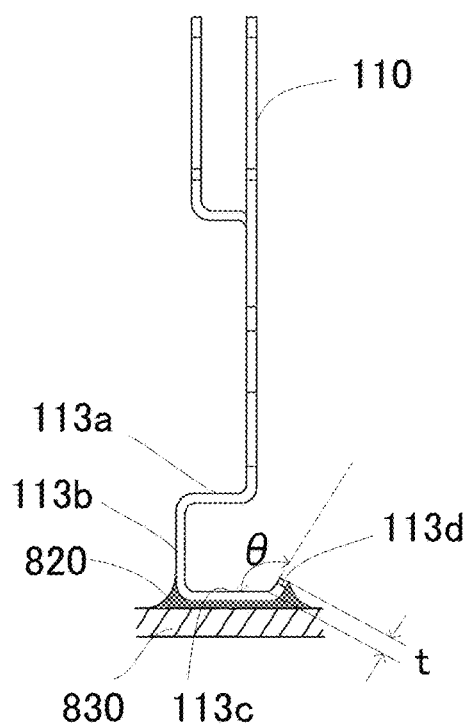

Accordingly, for example, based on the technical ideas, as before and after melting of the solder paste 830 illustrated in side views in FIGS. 15A and 15B, respectively, an angle θ at which a rising portion 113d rises from a solder coupling portion 113c, is formed not to be vertical but to have a shape including a smooth rise from the solder coupling portion 113c (namely, the angle θ is obtuse) and the length t thereof is appropriately provided so that the action from the solder paste 820 can be uniform. With this configuration, the tension uniformly acts on the outside portion near the curve of the rising portion 113d and the outside portion near the curve of the vertical portion 113b at both ends of the solder coupling portion 113c so that the angle of each of leads 110 can be retained in the coupling direction. Furthermore, this configuration can achieve facilitation of the bending of the leads.

Figure 16:
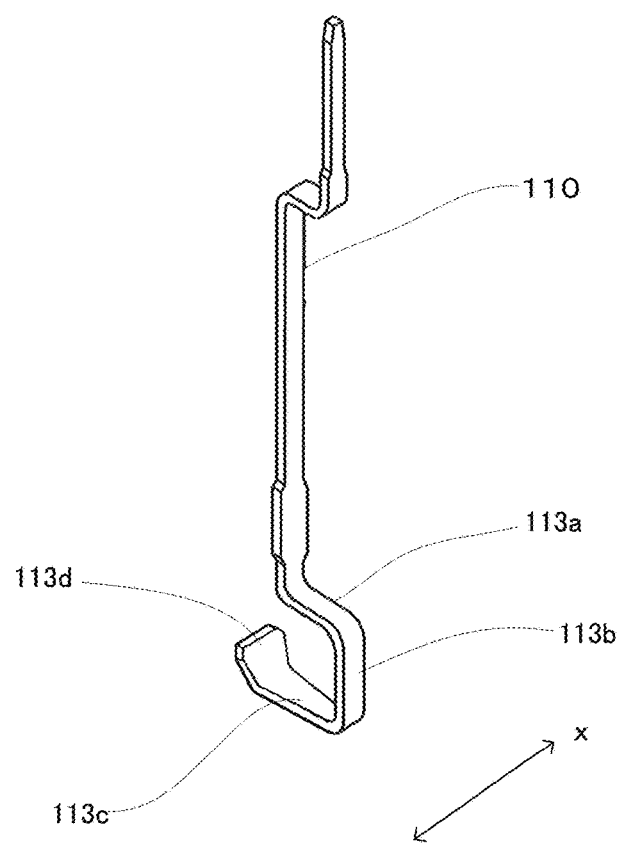
FIG. 16 is a perspective view of the width of the rising portion exemplarily enlarged over an end.
Figure 17:
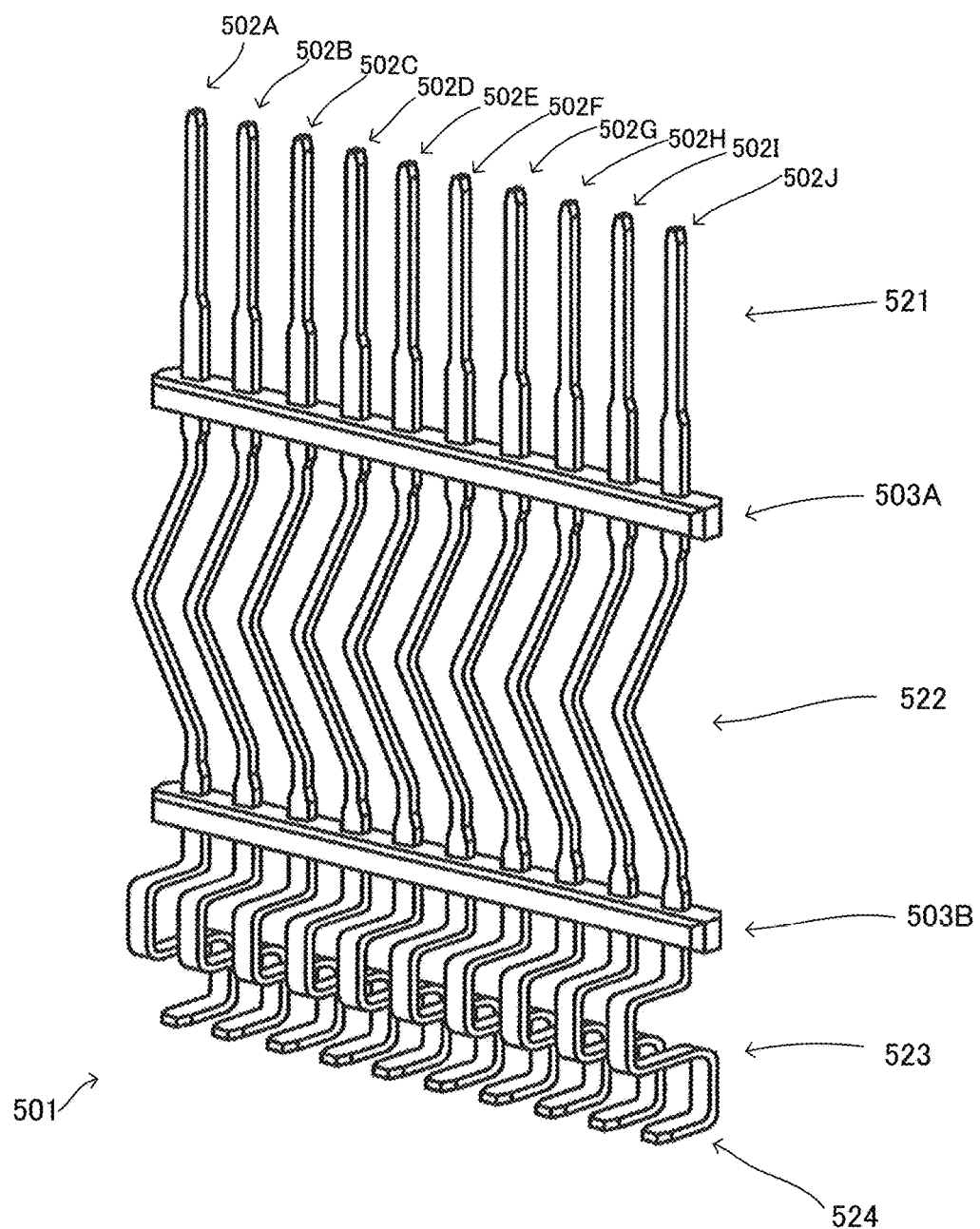
FIG. 17 is a perspective view of exemplary conventional multipolar lead parts for mutually coupling circuit boards each including electronic parts mounted thereon.
Figure 18A:
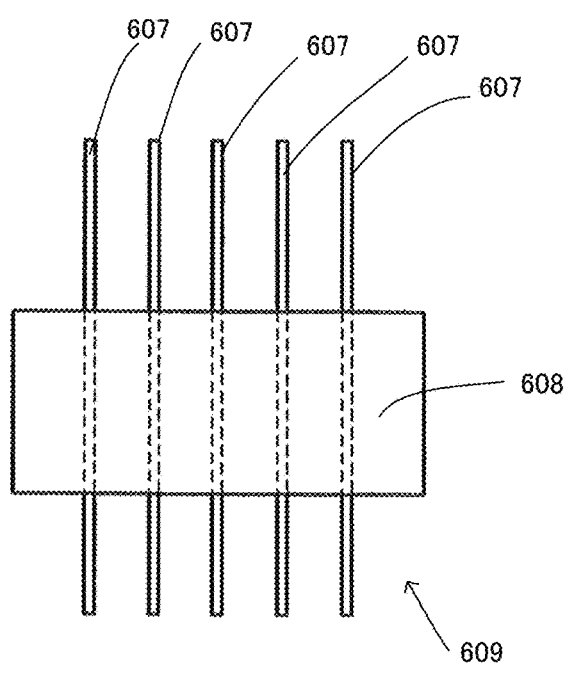
FIGS. 18A and 18B are a front view and a side view of another exemplary conventional multipolar lead parts for mutually coupling circuit boards each including an electronic parts thereon, respectively.
Figure 18B:
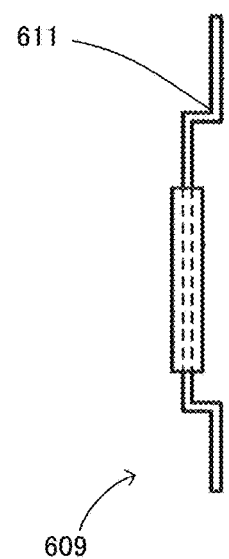
Figure 19:
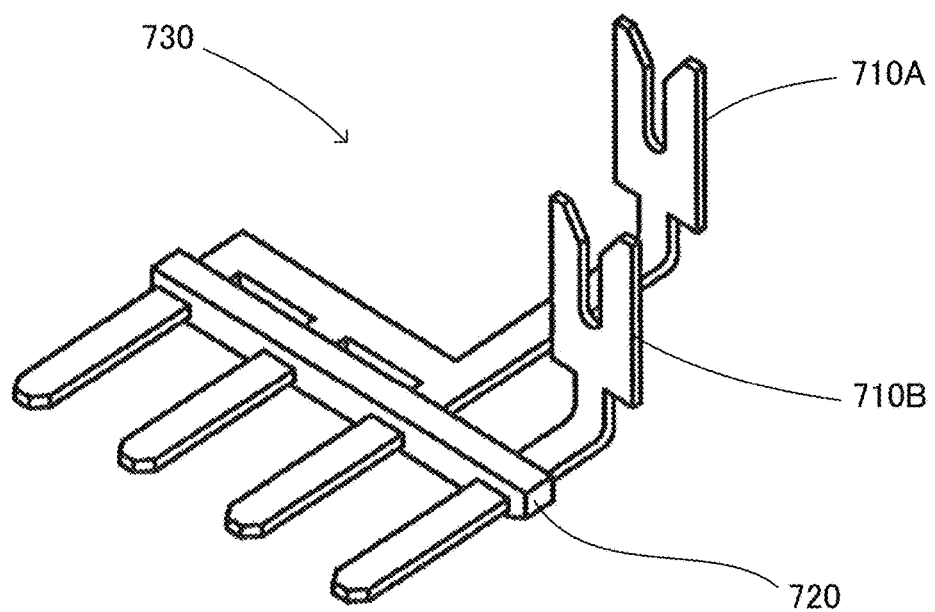
FIG. 19 is a perspective view of still another exemplary conventional multipolar lead parts.

Furthermore, for example, based on the similar technical ideas, as illustrated in a perspective view in FIG. 16, a rising portion 113d of a lead 110 widens in a width direction X of the lead 110 toward an end so as to increase the weight and a contact area. Thus, the action of the solder paste 820 on the lead 110 according to an outside portion near a curve of the rising portion 113d and an outside portion near a curve of a vertical portion 113b at both ends of a solder coupling portion 113c can be made uniformly due to the increase of the weight and the contact area. In this case, the spread in the width direction may be formed from a portion of the solder coupling portion 113c, or may be formed only at the rising portion 113d.

The multipolar lead parts and the board coupling device according to the present invention can effectively inhibit the position aberration in coupling the board and can further firmly and stably perform the coupling of the board.

EXPLANATION OF REFERENCE NUMERALS 1 handle
2 column shaft
3 reduction mechanism
4a 4b universal joint
5 pinion rack mechanism
6a 6b tie rod
7a 7b hub unit
9L 8R steered wheel
9 torque sensor
11 ignition key
11A ignition voltage monitoring unit
12 vehicle speed sensor
13 battery
14 steering angle sensor
30 control sensor (ECU)
101 multipolar lead parts
102 power source circuit portion
105 motor driving section
106 cut-off unit
108 control calculating section
109 gate driving section
110 leads (connector pins)
111 retaining portion
112 upper-side board coupling portion (through-hole coupling hole)
112a bending portion
113 lower-side board coupling portion (upper-side board coupling portion)
113a forward protruding portion
113b vertical portion
113c solder coupling portion
113d rising portion
120 retaining member
121 protective portion
122 incline surface
123 opening
501 multipolar lead parts
503A, 503B retaining member
521 upper-side coupling portion
522, 523 curved portion
607 coupling conductors
608 insulating plate
609 wiring board coupling tool
611 bending portion
710A, 710B insulation-displacement connector
720 resin member
730 insulation-displacement connector
810 lead
813 lower-side board coupling portion
820 solder paste
830 lower-side board

The invention claimed is:
1. Multipolar lead parts having plural leads arranged in one direction orthogonal to a coupling direction and a retaining member retaining said plural leads at a predetermined interval, comprising:
wherein said retaining member includes a cylindrical portion provided to a portion or an entirety of said plural leads so as to cover peripheries of said plural leads, said cylindrical portion facing in a board direction;
wherein said plural leads each include an upper-side board coupling portion provided on one end side and a lower-side board coupling portion provided on another end side;
wherein said lower-side board coupling portion comprises a forward protruding portion that another end side of each of said plural leads is bent in a direction orthogonal to an arrangement face of said plural leads, a vertical portion extending downward from a front end of said forward protruding portion, a solder coupling portion extending backward from a lower end of said vertical portion, and a rising portion extending upward from said solder coupling portion;
wherein said rising portion is formed as to have an obtuse angle from said solder coupling portion regardless of a bending angle of said vertical portion with respect to said solder coupling portion;
wherein a width of said rising portion increases from a portion of said solder coupling portion to an end of said rising portion;
wherein a solder is provided between a board and said solder coupling portion;
wherein a bending angle and the width of said rising portion are made so that an effect of the solder acting against a board side of said rising portion and against a board side of an outer side bending portion from a lower portion of said vertical portion to a solder connecting portion is substantially the same such that said plural leads extend substantially vertically from said board, and
wherein the solder is provided on the rising portion only at portions of the rising portion facing away from the vertical portion.

2. The multipolar lead parts according to claim 1, wherein said cylindrical portion is integrally formed with said retaining member.

3. The multipolar lead parts according to claim 1, wherein said cylindrical portion is provided to an outermost lead out of said plural leads which are arranged in parallel.

4. The multipolar lead parts according to claim 2, wherein said cylindrical portion is provided to an outermost lead out of said plural leads which are arranged in parallel.

5. The multipolar lead parts according to claim 1, wherein an end of said cylindrical portion is tapered.

6. The multipolar lead parts according to claim 2, wherein an end of said cylindrical portion is tapered.

7. The multipolar lead parts according to claim 3, wherein an end of said cylindrical portion is tapered.

8. The multipolar lead parts according to claim 4, wherein an end of said cylindrical portion is tapered.

9. The multipolar lead parts according to claim 1, wherein an intermediate portion of said cylindrical portion includes an opening for a presser foot fixture for suppressing a deformation of said plural leads.

10. The multipolar lead parts according to claim 2, wherein an intermediate portion of said cylindrical portion includes an opening for a presser foot fixture for suppressing a deformation of said plural leads.

11. The multipolar lead parts according to claim 3, wherein an intermediate portion of said cylindrical portion includes an opening for a presser foot fixture for suppressing a deformation of said plural leads.

12. The multipolar lead parts according to claim 1, wherein said solder coupling portion included in said lower-side board coupling portion of each of said plural leads is arranged zigzag in said arrangement direction of said plural leads.

13. The multipolar lead parts according to claim 2, wherein said solder coupling portion included in said lower-side board coupling portion of each of said plural leads is arranged zigzag in said arrangement direction of said plural leads.

14. The multipolar lead parts according to claim 3, wherein said solder coupling portion included in said lower-side board coupling portion of each of said plural leads is arranged zigzag in said arrangement direction of said plural leads.

15. A board coupling device comprising a pair of multipolar lead parts according to claim 4 arranged along and on opposite sides of a quadrangular board, wherein an end of a cylindrical portion provided to an outermost lead within second plural leads of one of the pair of multipolar lead parts supports another board.

16. A board coupling device comprising a pair of multipolar lead parts according to claim 10 arranged along and on opposite sides of a quadrangular board, wherein an end of a second cylindrical portion provided to a second outermost lead within second plural leads of one of the pair of multipolar lead parts supports another board.

17. A board coupling device comprising a pair of multipolar lead parts according to claim 13 arranged along and on opposite sides of a quadrangular board, wherein an end of a cylindrical portion provided outermost in second plural leads of one of the pair of multipolar lead parts supports another board.

* * * * *